(12) United States Patent
Cho et al.

(10) Patent No.: US 12,171,131 B2
(45) Date of Patent: Dec. 17, 2024

(54) DISPLAY DEVICE INCLUDING INSULATING LAYER DEFINING OPENING

(71) Applicant: Samsung Display Co., LTD., Yongin-si (KR)

(72) Inventors: Jung-Hyun Cho, Yongin-si (KR); Kang Wook Heo, Yongin-si (KR); Chi Wook An, Yongin-si (KR); Won Hak Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/122,302

(22) Filed: Mar. 16, 2023

(65) Prior Publication Data

US 2024/0008338 A1 Jan. 4, 2024

(30) Foreign Application Priority Data

May 24, 2022 (KR) .................. 10-2022-0063586

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 59/122* (2023.02); *H10K 59/873* (2023.02); *H10K 59/879* (2023.02)

(58) Field of Classification Search
CPC ..................................................... H10K 59/40
See application file for complete search history.

(56) References Cited

U.S. PATENT DOCUMENTS

| 6,072,450 A | 6/2000 | Yamada et al. |
| 7,535,646 B2 | 5/2009 | Chari et al. |

(Continued)

FOREIGN PATENT DOCUMENTS

| KR | 1020200078796 | 7/2020 |
| KR | 1020210086260 | 7/2021 |

(Continued)

OTHER PUBLICATIONS

Extended European Search Report—European Patent Application No. 23174790.8 dated Sep. 18, 2023, citing references listed within.

*Primary Examiner* — Chun-Nan Lin
(74) *Attorney, Agent, or Firm* — CANTOR COLBURN LLP

(57) ABSTRACT

A display device includes a substrate, a pixel electrode disposed on the substrate, a bank layer which is disposed on the pixel electrode and in which a pixel opening overlapping the pixel electrode is defined, an encapsulation layer disposed on the pixel electrode and the bank layer, a sensing electrode disposed on the encapsulation layer, a first insulating layer which is disposed on the sensing electrode and in which an opening overlapping the pixel opening is defined, and a second insulating layer disposed on the first insulating layer and having a higher refractive index than a refractive index of the first insulating layer. The opening of the first insulating layer includes a first edge and a second edge separated from an edge of the pixel opening and extending in different directions from each other and a first extension part disposed at a portion where the first edge and the second edge meet.

21 Claims, 23 Drawing Sheets

(51) Int. Cl.
    *H10K 59/122*    (2023.01)
    *H10K 59/80*    (2023.01)

(56) References Cited

U.S. PATENT DOCUMENTS

| | | |
|---|---|---|
| 9,142,802 B2 | 9/2015 | Miyamoto et al. |
| 2015/0333108 A1 | 11/2015 | Myamoto et al. |
| 2019/0165061 A1* | 5/2019 | Jung .................... H10K 50/844 |
| 2020/0266390 A1* | 8/2020 | Jung .................... G06F 3/0446 |
| 2021/0028254 A1 | 1/2021 | Yan |
| 2021/0043697 A1 | 2/2021 | Kim et al. |
| 2021/0367212 A1* | 11/2021 | Kim ....................... H10K 59/12 |
| 2022/0140010 A1 | 5/2022 | Lee |

FOREIGN PATENT DOCUMENTS

| | | |
|---|---|---|
| KR | 1020210145028 | 12/2021 |
| KR | 1020220106264 | 7/2022 |

\* cited by examiner

S : S1, S2, S3, S4

DISPLAY DEVICE INCLUDING INSULATING LAYER DEFINING OPENING

This application claims priority to Korean Patent Application No. 10-2022-0063586, filed on May 24, 2022, and all the benefits accruing therefrom under 35 U.S.C. § 119, the content of which in its entirety is herein incorporated by reference.

BACKGROUND

1. Field

The disclosure relates to a display device.

2. Description of the Related Art

Display devices include a liquid crystal display ("LCD"), a plasma display panel ("PDP"), an organic light-emitting diode ("OLED") display device, a field emission display ("FED"), an electrophoretic display, etc.

The display device consists of a multi-layered structure. The display device may have a multi-layered structure in which a light-emitting element, a touch sensor, etc., are stacked on a substrate, for example. The light generated from the light-emitting element passes through these layers and is emitted to the outside of the display device, so that a screen may be displayed.

SUMMARY

Some of light generated by a light-emitting element may be lost without being emitted to the outside, such as being reflected from an inter-interface. As a result, there is a problem that front light output efficiency and display quality of the display device deteriorate.

Embodiments are to provide a display device capable of improving light output efficiency and display quality.

However, the feature to be achieved by the embodiments is not limited to the above-mentioned features, but may be variously expanded without departing from the technical spirit of this disclosure.

A display device in an embodiment includes a substrate, a pixel electrode disposed on the substrate, a bank layer which is disposed on the pixel electrode and in which a pixel opening overlapping the pixel electrode, an encapsulation layer disposed on the pixel electrode and the bank layer is defined, a sensing electrode disposed on the encapsulation layer, a first insulating layer which is disposed on the sensing electrode and in which an opening overlapping the pixel opening is defined, and a second insulating layer disposed on the first insulating layer and having a higher refractive index than a refractive index of the first insulating layer. The opening of the first insulating layer includes a first edge and a second edge separated from an edge of the pixel opening and extending in different directions from each other and a first extension part disposed at a portion where the first edge and the second edge meet.

In an embodiment, the first extension part may have a first width and a first length, and the first length may be larger than the first width.

In an embodiment, the first width may be smaller than about 4 micrometers ($\mu m$).

In an embodiment, the thickness of the second insulating layer may be about 9 $\mu m$ to about 11 $\mu m$.

In an embodiment, the first extension part may include a first sub-extension part and a second sub-extension part extending in a direction parallel to a first direction, and a third sub-extension part and a fourth sub-extension part extending in a direction parallel to a second direction different from the first direction, an imaginary first line overlapping the first sub-extension part and parallel to the first direction and an imaginary second line overlapping the second sub-extension part and parallel to the first direction that may not overlap each other, an imaginary third line overlapping the third sub-extension part and parallel to the second direction and an imaginary fourth line overlapping the fourth sub-extension part and parallel to the second direction that may not overlap each other.

In an embodiment, the second extension part may include a fifth sub-extension part and a sixth sub-extension part extending in a direction parallel to a third direction oblique to the first direction and the second direction, and a seventh sub-extension part and an eighth sub-extension part extending in a fourth direction oblique to the first direction and the second direction and different from the third direction, the fifth sub-extension part and the sixth sub-extension part may overlap an imaginary fifth line parallel to the third direction, and the seventh sub-extension part and the eighth sub-extension part may overlap an imaginary sixth line parallel to the fourth direction.

In an embodiment, the opening of the first insulating layer may further include a second extension part disposed at the center of the first edge and the second edge.

In an embodiment, the second extension part may have a second width and a second length, and the second length may be larger than the second width.

In an embodiment, the second width may decrease as the second width is farther from the edge of the pixel opening, and the second width may be smaller than about 4 $\mu m$.

In an embodiment, the second length may be equal to or shorter than the first length.

In an embodiment, the pixel opening may include a plurality of pixel opening edges extending in different directions, and the pixel opening may have a polygonal planar shape with a chamfered corner between adjacent pixel opening edges of the plurality of pixel opening edges extending in the different directions.

In an embodiment, in a plan view, the opening of the first insulating layer may be larger than the pixel opening, and the first edge and the second edge of the opening of the first insulating layer may be substantially parallel to the plurality of pixel opening edges.

In an embodiment, an end of the first extension part may have a convex curved line shape.

In an embodiment, a width of the first extension part may decrease as the width of the first extension part is farther from the edge of the pixel opening.

In an embodiment, an end of the first extension part may have a planar shape that is pointed toward the end.

In an embodiment, an end of the first extension part may have a planar shape of a straight line.

A display device in an embodiment includes a substrate, a plurality of pixel electrodes disposed on the substrate, a bank layer which is disposed on a plurality of pixel electrodes and in which a plurality of pixel openings overlapping a plurality of pixel electrodes is defined, an encapsulation layer disposed on the plurality of pixel electrodes and the bank layer, a sensing electrode disposed on the encapsulation layer, a first insulating layer which is disposed on the sensing electrodes and in which a plurality of first openings overlapping pixel openings among the plurality of pixel openings is defined, and a second insulating layer disposed on the first insulating layer and that has a higher refractive index than a refractive index of the first insulating layer, and each of the plurality of first openings of the first insulating layer is separated from the edge of the pixel openings and includes a first edge and a second edge extending in different directions and a first extension part disposed at a portion where the first edge and the second edge meet.

In an embodiment, the plurality of pixel openings may include a first pixel opening in which an emission layer emitting a first color is disposed, a second pixel opening and a third pixel opening in which an emission layer emitting a second color is disposed, and a fourth pixel opening in which an emission layer emitting a third color is disposed, and the plurality of first openings may overlap the first pixel opening and the fourth pixel opening.

In an embodiment, the plurality of pixel openings may include a plurality of dots including a first pixel opening in which an emission layer emitting a first color is disposed, a second pixel opening and a third pixel opening in which an emission layer emitting a second color is disposed, and a fourth pixel opening in which an emission layer emitting a third color is disposed, and the plurality of first openings may overlap some dots among the plurality of dots.

By embodiments, light output efficiency and display quality of the display device may be improved.

The effects of the disclosure is not limited to the above-described effects, and may be expanded in various ways in the range of the ideas and the areas of this disclosure.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
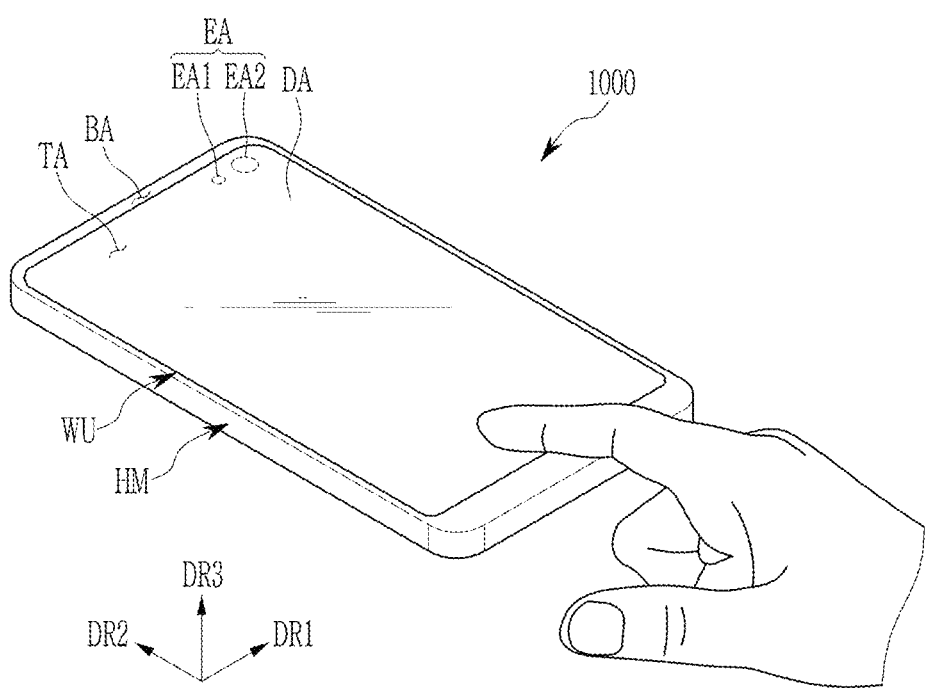
FIG. 1 is a schematic perspective view showing an embodiment of a use state of a display device.

The embodiments will be described more fully hereinafter with reference to the accompanying drawings, in which embodiments are shown. As those skilled in the art would realize, the described embodiments may be modified in various different ways, all without departing from the spirit or scope of this disclosure.

In order to clarify the embodiments, parts that are not connected with the description will be omitted, and the same elements or equivalents are referred to by the same reference numerals throughout the specification.

Further, the accompanying drawings are provided only in order to allow embodiments disclosed in the specification to be easily understood, and are not to be interpreted as limiting the spirit disclosed in the specification, and it is to be understood that the embodiments includes all modifications, equivalents, and substitutions without departing from the scope and spirit of this disclosure.

Further, since sizes and thicknesses of constituent members shown in the accompanying drawings are arbitrarily given for better understanding and ease of description, the embodiments are not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

In addition, in the specification, when referring to "connected to", this does not only mean that two or more constituent elements are directly connected, but also that two or more constituent elements are electrically connected through other constituent elements as well as being indirectly connected and being physically connected, or it may mean that they are referred to by different names according to a position or function, but are integrated.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

The term such as "module" as used herein is intended to mean a software component or a hardware component that performs a predetermined function. The hardware component may include a field-programmable gate array ("FPGA") or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

Hereinafter, various embodiments and variations are described in detail with reference to the drawings.

Figure 2:
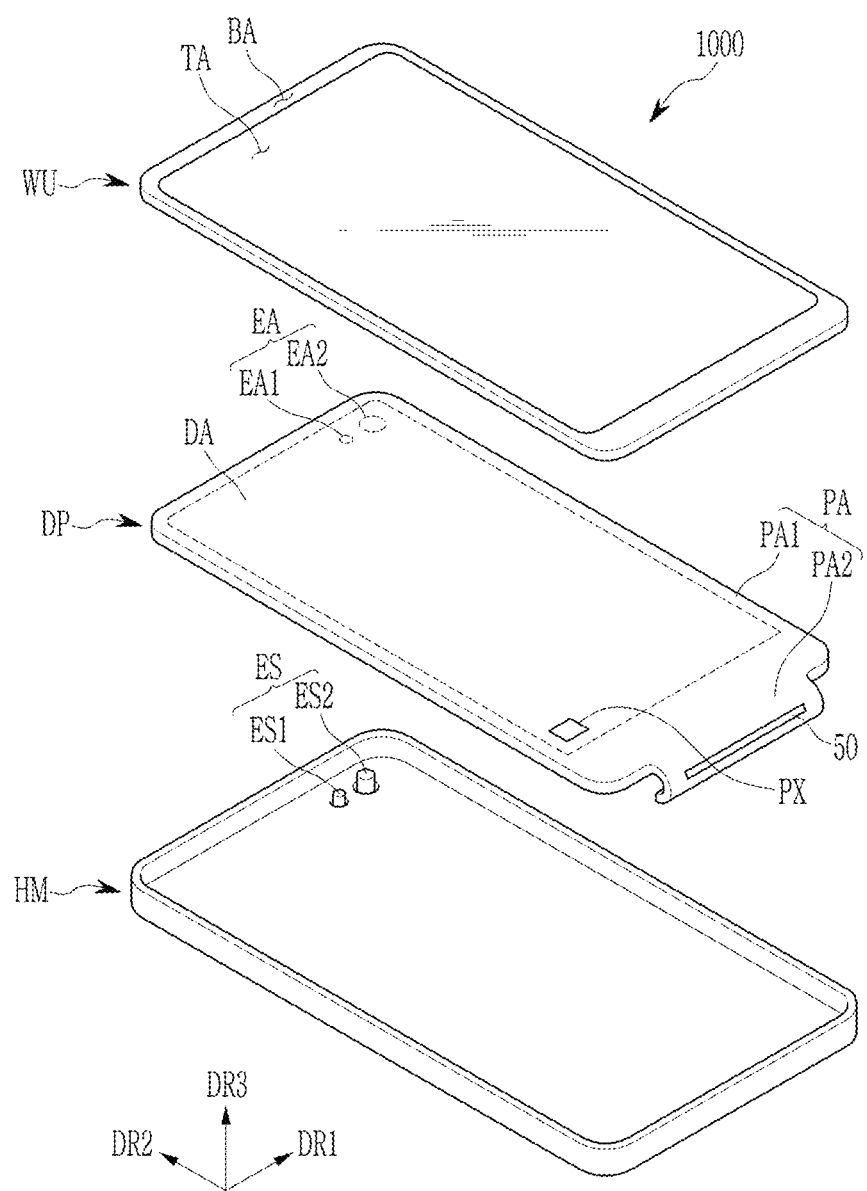
FIG. 2 is an exploded perspective view of an embodiment of a display device.
Figure 3:
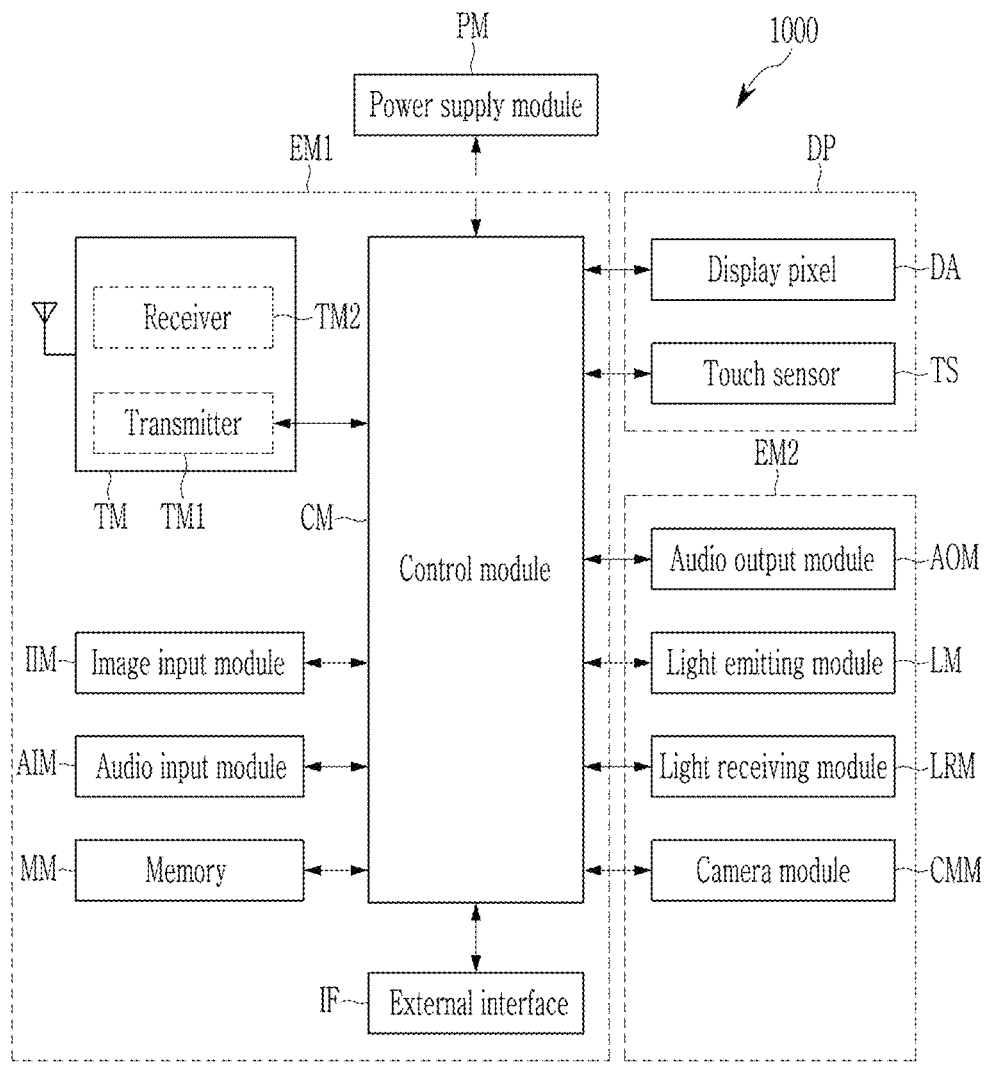
FIG. 3 is a block diagram of an embodiment of a display device.

Hereinafter, a schematic structure of the display device is described through FIG. 1 to FIG. 3. FIG. 1 is a schematic perspective view showing an embodiment of a use state of a display device, FIG. 2 is an exploded perspective view of an embodiment of a display device, and FIG. 3 is a block diagram of a display device.

Referring to FIG. 1, a display device 1000 in an embodiment may display a motion picture or a still image, and may be used as a display screen of various products such as a television, a laptop, a monitor, an advertisement board, the Internet of things ("IOT"), etc., as well as portable electronic devices such as a mobile phone, a smart phone, a tablet personal computer, a mobile communication terminal, an electronic notebook, an e-book, a portable multimedia player ("PMP"), a navigation device, a ultra-mobile personal computer ("UMPC"), etc. In addition, the display device 1000 in an embodiment may be used in a wearable device such as a smart watch, a watch phone, a glasses display, and a head mounted display ("HMD"). In addition, the display device 1000 in an embodiment may be used as an instrument panel of a car, and a center fascia of the car or a center information display ("CID") disposed on a dashboard, a room mirror display that replaces a side mirror of the car, an entertainment device for a rear seat of the car, or a display disposed on the rear surface of the front seat. FIG. 1 shows that the display device 1000 is used as a smartphone for better comprehension and ease of description.

The display device 1000 may display an image in a third direction DR3 on a display surface parallel to each of a first direction DR1 and a second direction DR2. The display surface on which the image is displayed may correspond to the front surface of the display device 1000 and may correspond to the front surface of a cover window WU. The images may include static images as well as dynamic images.

In the illustrated embodiment, a front surface (or an upper surface) and a rear surface (or a lower surface) of each member are defined based on the direction in which the image is displayed. The front surface and the rear surface may be opposed to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The display device 1000 in an embodiment may detect an input (referring to a hand in FIG. 1) of a user applied from the outside. The input of the user may include various types of external inputs such as a part of the user's body, light, heat, or pressure. In an embodiment, the user's input is shown with the user's hand applied to the front. However, the disclosure is not limited thereto. The user input may be provided in various forms. The user's input applied to the side surface or the rear surface of the display device 1000 according to the structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to constitute the appearance of the display device 1000.

The cover window WU may include an insulating panel. In an embodiment, the cover window WU may include glass, plastic, or any combinations thereof, for example.

The front surface of the cover window WU may define the front surface of the display device 1000. The transmissive area TA may be an optically transparent area. In an embodiment, the transmissive area TA may be an area having visible ray transmittance of about 90% or more, for example.

The blocking area BA may define the shape of the transmissive area TA. The blocking area BA is adjacent to the transmissive area TA and may surround the transmissive area TA. The blocking area BA may be an area having relatively low light transmittance compared to a light transmittance of the transmissive area TA. The blocking area BA may include an opaque material that blocks light. The blocking area BA may have a predetermined color. The blocking area BA may be defined by a bezel layer provided separately from the transparent substrate defining the transmissive area TA, or may be defined by an ink layer formed by inserting or coloring it into the transparent substrate.

The display panel DP may include the front surface including a display area DA and a non-display area PA. The display area DA may be an area in which a pixel operates and emits light according to an electrical signal. The non-display area PA of the display panel DP may include a driver 50.

In an embodiment, the display area DA is an area in which the image is displayed by including the pixel, and may be an area in which an external input is sensed by simultaneously positioning a touch sensor on the upper side in the third direction DR3.

The transmissive area TA of the cover window WU may at least partially overlap the display area DA of the display panel DP. In an embodiment, the transmissive area TA may overlap the front surface of the display area DA or may overlap at least a portion of the display area DA, for example. Accordingly, the user may recognize the image through the transmissive area TA or provide the external input based on the image. However, the disclosure is not limited thereto. In an embodiment, in the display area DA, an area in which the image is displayed and an area in which the external input is detected may be separated from each other, for example.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image is not displayed in the non-display area PA, and a driving circuit or driving wiring for driving the display area DA may be disposed. The non-display area PA may include a first peripheral area PA1 disposed outside the display area DA and a second peripheral area PA2 including a driver connection wiring, and a bending area. In the embodiment of FIG. 2, the first peripheral area PA1 is disposed on three sides of the display area DA, and the second peripheral area PA2 is disposed on the other side of the display area DA. However, the disclosure is not limited thereto, and the number and the location of the first peripheral area PA1 and the second peripheral area PA2 may be different in other embodiments.

In an embodiment, the display panel DP may be assembled in a flat state in which the display area DA and the non-display area PA face the cover window WU. However, the disclosure is not limited thereto. The part of the non-display area PA of the display panel DP may be bent. In this case, the portion of the non-display area PA faces the rear surface of the display device 1000, so that the blocking area BA shown on the front surface of the display device 1000 may be reduced, and as shown in FIG. 2, the second peripheral area PA2 may be bent to be disposed on the rear surface of the display area DA, and then assembled.

In addition, the display panel DP may include a component area EA, and specifically, may include a first component area EA1 and a second component area EA2. The first component area EA1 and the second component area EA2 may be at least partially surrounded by the display area DA. Although the first component area EA1 and the second component area EA2 are shown to be spaced apart from each other, the disclosure is not limited thereto, and at least some of them may be connected. The first component area EA1 and the second component area EA2 may be areas in which a component using infrared rays, visible rays, or a sound is disposed below the first component area EA1 and the second component area EA2.

The display area DA includes a plurality of light-emitting diodes LED (refer to FIG. 6A), and a plurality of pixel circuit parts for generating and transmitting a light-emitting current to each of a plurality of light-emitting diodes LED. Here, one light-emitting element LED and one pixel circuit part together are also referred to as a pixel PX. In the display area DA, one pixel circuit part and one light-emitting element LED are formed one-to-one.

The first component area EA1 includes an area composed of a transparent layer to allow light to pass therethrough. In the first component area EA1, a conductive layer or a semiconductor layer is not disposed, and an opening defined in a pixel defining layer and a light-blocking layer including a light-blocking material overlaps the first component area EA1, thereby having a structure that does not block light.

The second component area EA2 may include a transmissive part through which light or/and sound may pass and a display part including a plurality of pixels. The transmissive part is disposed between adjacent pixels and consists of a transparent layer through which light or/and sound may pass. The display part may have one unit structure by adding a plurality of pixels, and the transmissive part may be disposed between adjacent unit structures.

Referring to FIG. 3 in addition to FIG. 1 and FIG. 2, the display panel DP may include the display area DA including the display pixel, and the touch sensor TS. The display panel DP may be visually recognized by the user from the outside through the transmissive area TA including the pixel that generates the image. In addition, the touch sensor TS may be disposed on the pixel, and may detect the external input applied from the outside. The touch sensor TS may detect the external input provided to the cover window WU.

Referring back to FIG. 2, the second peripheral area PA2 may include a bending part. The display area DA and the first peripheral area PA1 may have a flat state substantially parallel to the plane defined by the first direction DR1 and the second direction DR2, and one side of the second peripheral area PA2 may extend from the flat state and have the flat state again after going through the bending part. At least a part of the second peripheral area PA2 may be bent and assembled to be disposed on the rear surface side of the display area DA. At least a portion of the second peripheral area PA2 overlaps the display area DA in a plan view when being assembled, so that the blocking area BA of the display device 1000 may be reduced. However, the disclosure is not limited thereto. In an embodiment, the second peripheral area PA2 may not be bent, for example.

The driver 50 may be disposed (e.g., mounted) on the second peripheral area PA2, and may be disposed (e.g., mounted) on the bending part or disposed on one of opposite sides of the bending part. The driver 50 may be provided in the form of a chip.

The driver 50 may be electrically connected to the display area DA to transmit an electrical signal to the display area DA. In an embodiment, the driver 50 may provide data signals to the pixels PX disposed in the display area DA, for example. In an alternative embodiment, the driver 50 may include a touch driving circuit and may be electrically connected to the touch sensor TS disposed in the display area DA. The driver may be designed to include various circuits in addition to the above-described circuits or to provide various electrical signals to the display area DA.

A pad part may be disposed at the end of the second peripheral area PA2, and the display device 1000 may be electrically connected to a flexible printed circuit board ("FPCB") including a driving chip by the pad part. Here, the driving chip disposed on the flexible printed circuit board may include various driving circuits for driving the display device 1000 or connectors for power supply. According to the embodiment, instead of the flexible printed circuit board, a rigid printed circuit board ("PCB") may be used.

The optical element ES may be disposed under the display panel DP. The optical element ES may include a first optical element ES1 overlapping the first component area EA1 and a second optical element ES2 overlapping the second component area EA2.

The first optical element ES1 may be an electronic element using light or sound. In an embodiment, the first optical element ES1 may be a sensor that receives and uses light such as an infrared sensor, a sensor that outputs and senses light or sound to measure a distance or recognize a fingerprint, a small lamp that outputs light, or a speaker that outputs a sound, etc., for example. Of course, in the case of the electronic element using light, light of various wavelength bands such as visible light, infrared light, and ultra-violet light may be used.

The second optical element ES2 may be at least one of a camera, an infrared ("IR") camera, a dot projector, an infrared illuminator, and a time-of-flight ("ToF") sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, the display pixel and the touch sensor TS disposed in the display area DA among the configurations of the display panel DP are shown as an example.

The power supply module PM may supply power desired for the overall operation of the display device 1000. The power supply module PM may include a various types of battery modules.

The first electronic module EM1 and the second electronic module EM2 may include various functional modules for operating the display device 1000. The first electronic module EM1 may be directly disposed (e.g., mounted) on the motherboard electrically connected to the display panel DP, or disposed (e.g., mounted) on a separate substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules are not disposed (e.g., mounted) on the motherboard and may be electrically connected to the motherboard through a flexible printed circuit board connected thereto.

The control module CM may control the overall operation of the display device 1000. The control module CM may be a microprocessor. In an embodiment, the control module CM activates or deactivates the display panel DP, for example. The control module CM may control other modules such as the image input module IIM or the audio input module AIM based on the touch signal received from the display panel DP.

The wireless communication module TM may transmit/receive a wireless signal with other terminals using Bluetooth™ or Wi-Fi. The wireless communication module TM may transmit/receive voice signals by a general communication line. The wireless communication module TM includes a transmitter TM1 that modulates and transmits a signal to be transmitted, and a receiver TM2 that demodulates a received signal.

The image input module IIM may process the image signal to be converted into image data that may be displayed on the display panel DP. The audio input module AIM may receive an external sound signal by a microphone in a recording mode, a voice recognition mode, etc., to be converted into electrical voice data.

The external interface IF may serve as an interface connected to an external charger, a wired/wireless data port, or a card socket (e.g., a memory card, a subscriber identity module/user identity module ("SIM/UIM") card).

The second electronic module EM2 may include an audio output module AOM, a light-emitting module LM, a light-receiving module LRM, and a camera module CMM, and at least some of these as the optical elements ES, as shown in FIG. 1 and FIG. 2, may be disposed on the rear surface of the display panel DP. The optical element ES may include a light-emitting module LM, a light-receiving module LRM, and a camera module CMM. In addition, the second electronic module EM2 may be directly disposed (e.g., mounted) on the motherboard, or disposed (e.g., mounted) on a separate substrate and electrically connected to the display panel DP through a connector (not shown), or electrically connected to the first electronic module EM1.

The audio output module AOM may convert audio data received from the wireless communication module TM or audio data stored in the memory MM to be output to the outside.

The light-emitting module LM may generate and output light. The light-emitting module LM may output infrared light. In an embodiment, the light-emitting module LM) may include a light-emitting element LED, for example. In an embodiment, the light-receiving module LRM may detect infrared light, for example. The light-receiving module LRM may be activated when infrared light above a predetermined level is detected. The light-receiving module LRM may include a complementary metal-oxide-semiconductor ("CMOS") sensor. After the infrared light generated by the light-emitting module LM is output, the light may be reflected by an external subject (e.g., a user's finger or a face), and the reflected infrared light may be incident on the light-receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. Also, the optical element ES may include a plurality of configurations, and is not limited to any particular embodiment.

Referring back to FIG. 2, the housing HM may be combined with the cover window WU. The cover window WU may be disposed in front of the housing HM. The housing HM may be combined with the cover window WU to provide a predetermined accommodation space. The light-emitting display panel DP and the optical element ES may be accommodated in a predetermined accommodation space provided between the housing HM and the cover window WU.

The housing HM may include a material with relatively high stiffness. In an embodiment, the housing HM may include a plurality of frames and/or plates including glass, plastic, or metal, or any combinations thereof, for example. The housing HM may reliably protect the components of the light-emitting display device 1000 housed in the interior space from external impact.

Figure 4:
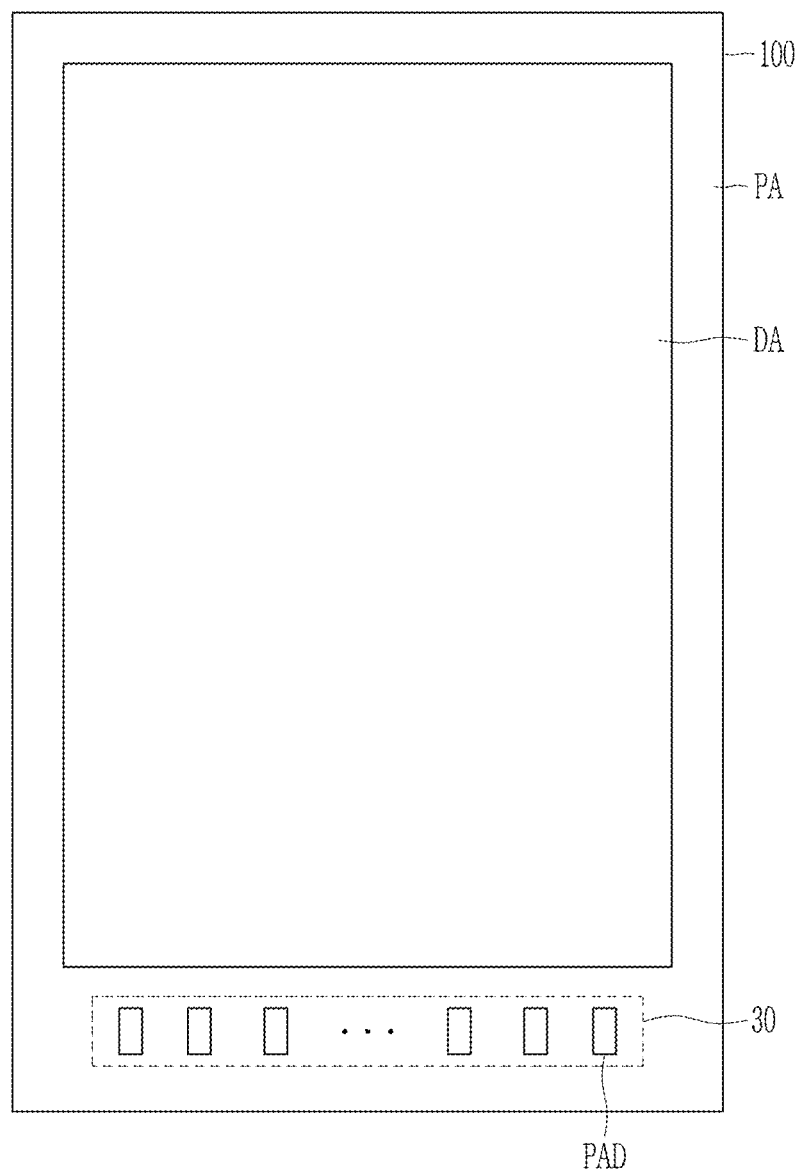
FIG. 4 is a schematic top plan view of an embodiment of a part of a display device.
Figure 5:
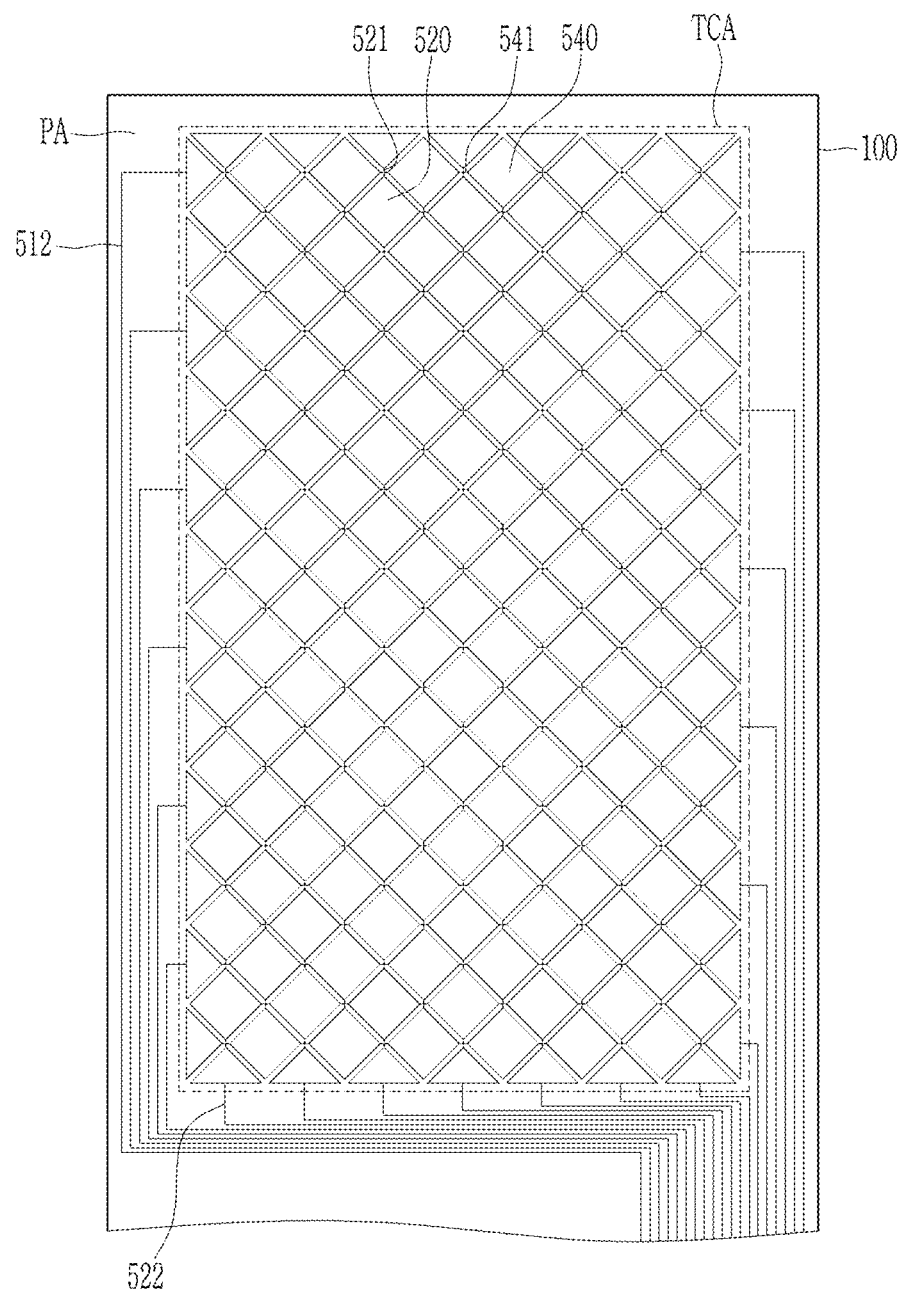
FIG. 5 is a top plan view of a portion including an embodiment of a sensing unit in a display device.

The display panel of the display device in an embodiment is described with reference to FIG. 4 and FIG. 5. FIG. 4 is a schematic top plan view of an embodiment of a part of a display device, and FIG. 5 is a top plan view of an embodiment of a portion including a sensing unit in a display device.

Referring to FIG. 4, the display panel DP of the display device 1000 in an embodiment includes a substrate 100 and a pad part 30.

The substrate 100 includes a display area DA and a non-display area PA. The display area DA is an area in which a pixel including a light-emitting element LED (refer to FIG. 6A) and a transistor displays an image, and the non-display area PA is an area in which an image is not displayed. The non-display area PA may surround the display area DA. The non-display area PA is an area including the pad part 30 in which a pad PAD that applies a driving signal to the pixel is formed.

In the display area DA, a plurality of pixels (not shown) including a transistor, a light-emitting element LED, or the like may be disposed. A plurality of pixels may be arranged in various forms. In an embodiment, the plurality of pixels may be arranged in a matrix form, for example.

Referring to FIG. 5 together with FIG. 1, a sensing area TCA including a plurality of sensing electrodes 520 and 540 may be disposed on the display area DA to detect a touch. The sensing area TCA may be an area where the touch sensor is disposed.

In the non-display area PA, a driving voltage line (not shown), a driving low voltage line (not shown), and a pad part 30 for transmitting driving signals such as a voltage and a signal to the pixels formed in the display area DA may be disposed. In addition, a plurality of sensing wires 512 and 522 may be further disposed in the non-display area PA. A plurality of sensing wires 512 and 522 may be connected to a plurality of sensing electrodes 520 and 540.

The pad part 30 is disposed on a portion of the non-display area PA, and includes a plurality of pads PAD. A voltage, a signal, etc., may be applied to a plurality of voltage lines (not shown), and a plurality of sensing wires 512 and 522 connected to the display area DA through a plurality of pads PAD. An FPCB (not shown) may be attached to the non-display area PA. The FPCB may be electrically connected to the pad part 30. The FPCB and the pad part 30 may be electrically connected by an anisotropic conductive film. The FPCB may include a driving integrated chip (not shown), and a driving signal output from the driving integrated circuit may be supplied to each pixel through a plurality of pads PAD of the pad part 30.

As shown in FIG. 2, the substrate 100 may include the sensing area TCA where a plurality of sensing electrodes 520 and 540 is formed on the display area DA and the non-display area PA surrounding the sensing area TCA. According to the embodiment, the sensing area TCA may include the display area DA shown in FIG. 1 and a part of the non-display area PA. However, this is merely one of embodiments, and the position of the sensing area TCA may be changed in various ways. In an embodiment, the sensing area TCA may include a part of the display area DA, or the sensing area TCA may include the display area DA and the non-display area PA, for example.

The sensing area TCA may include a plurality of sensing electrodes 520 and 540. A plurality of sensing electrodes 520 and 540 may include a plurality of first sensing electrodes 520 and a plurality of second sensing electrodes 540.

The first sensing electrode 520 and the second sensing electrode 540 may be electrically isolated from each other. In an embodiment, the first sensing electrode 520 may be a sensing input electrode, and the second sensing electrode 540 may be a sensing output electrode. However, the disclosure is not limited thereto, and the first sensing electrode 520 may be a sensing output electrode, while the second sensing electrode 540 may be a sensing input electrode.

A plurality of first sensing electrodes 520 and a plurality of second sensing electrodes 540 may be alternately dispersed so as to not overlap each other in the sensing area TCA and disposed in a form of a mesh. A plurality of first sensing electrodes 520 may be disposed in the column direction and the row direction, respectively, and a plurality of second sensing electrodes 540 may also be disposed in the column direction and in the row direction. A plurality of first sensing electrodes 520 may be connected to each other in a column direction by a plurality of first sensing electrode connections 521, and a plurality of second sensing electrodes 540 may be connected to each other in a row direction by a plurality of second sensing electrode connections 541.

The first sensing electrode 520 and the second sensing electrode 540 may be disposed in the same layer. According to the embodiment, the first sensing electrode 520 and the second sensing electrode 540 may be disposed in different layers. The first sensing electrode 520 and the second sensing electrode 540 may have a rhombus shape, but are not limited thereto. The first sensing electrode 520 and the second sensing electrode 540 may be polygonal such as quadrangular or hexagonal, or may be circular or oval, and may be implemented in various shapes such as having a protruded part to improve sensitivity of the sensing sensor. The first sensing electrode 520 and the second sensing electrode 540 may include a transparent conductor or an opaque conductor. In an embodiment, the first sensing electrode 520 and the second sensing electrode 540 may include a transparent conductive oxide ("TCO"), and the TCO may include at least one of indium tin oxide ("ITO"), indium zinc oxide ("IZO"), zinc oxide (ZnO), carbon nanotubes ("CNT"), and graphene, for example. Also, a plurality of openings may be defined in the first sensing electrode 520 and the second sensing electrode 540. The openings defined in the sensing electrodes 520 and 540 serve to allow the light emitted from the light-emitting element LED (refer to FIG. 6A) to be emitted to the front without interference.

A plurality of first sensing electrodes 520 may be electrically connected to each other by a first sensing electrode connection 521 (also referred to as a bridge), and a plurality of second sensing electrodes 540 may be electrically connected to each other by a second sensing electrode connection 541. When a plurality of first sensing electrodes 520 is connected in a first direction, a plurality of second sensing electrodes 540 may be connected in a second direction crossing the same. When the first sensing electrode 520 and the second sensing electrode 540 are disposed in the same layer, one of the first sensing electrode connection 521 and the second sensing electrode connection 541 may be disposed in the same layer as the first sensing electrode 520 and the second sensing electrode 540, and the other may be disposed in a different layer from the first sensing electrode 520 and the second sensing electrode 540. As a result, a plurality of first sensing electrodes 520 and a plurality of second sensing electrodes 540 may be electrically separated. The sensing electrode connections disposed in different layers may be disposed on the upper or lower layer of the first sensing electrode 520 and the second sensing electrode 540, and in the embodiment described below, it is mainly described in an embodiment in which the sensing electrode connection is disposed in the lower layer, that is, a layer closer to the substrate.

A plurality of sensing wires 512 and 522 respectively connected to a plurality of first sensing electrodes 520 and a plurality of second sensing electrodes 540 is disposed in the non-display area PA. A plurality of sensing wires 512 and 522 may include a plurality of first sensing wires 512 and a plurality of second sensing wires 522. The first sensing wires 512 may be connected to a plurality of second sensing electrodes 540 disposed in a row direction, and the second sensing wires 522 may be connected to a plurality of first sensing electrodes 520 disposed in a column direction. According to the embodiment, the first sensing wires 512 and the second sensing wires 522 may be electrically connected to a part among the pad PAD included in the pad part 30 of FIG. 1.

FIG. 5 shows a sensing unit of a mutual-cap type that senses the touch using two sensing electrodes 520 and 540. However, depending on the embodiment, it may be formed as a self-cap type sensing unit that senses the touch by only one sensing electrode.

Hereinafter, the display device in the embodiment is further described based in a cross-section diagram in the display area DA with reference to FIG. 6A and FIG. 6B.

Figure 6A:
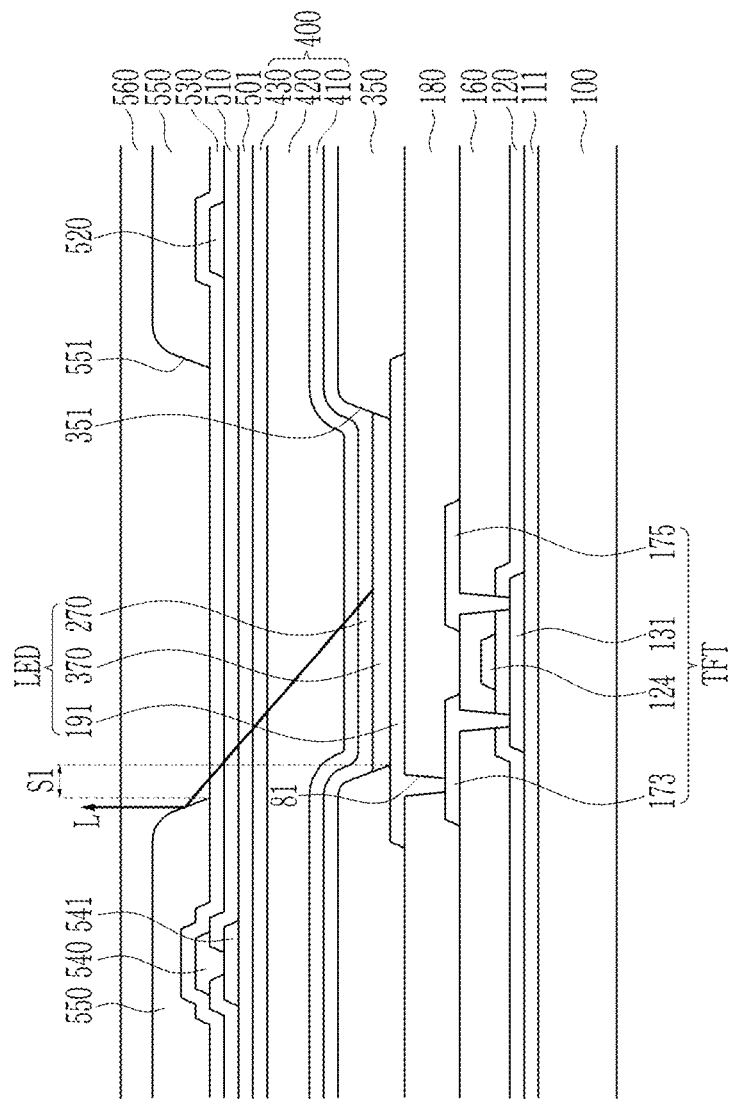
FIG. 6A is a cross-sectional view illustrating an embodiment of a portion of a display area in a display device.

FIG. 6A is a cross-sectional view illustrating an embodiment of a portion of a display area in a display device.

As shown in FIG. 6A, the display area DA of the display device in an embodiment may include a substrate 100, a transistor TFT disposed on the substrate 100 and including a semiconductor 131, a gate electrode 124, a source electrode 173, and a drain electrode 175, a gate insulating layer 120, a first inter-insulating layer 160, a second inter-insulating layer 180, a pixel electrode 191, an emission layer 370, a bank layer 350, a common electrode 270, and an encapsulation layer 400. Here, the pixel electrode 191, the emission layer 370, and the common electrode 270 may form the light-emitting element LED. In addition, the display device may further include a sensing area TCA disposed above the display area DA, wherein the sensing area TCA may include a first sensing insulating layer 510, a second sensing insulating layer 530, a plurality of sensing electrodes 520 and 540, and a sensing electrode connection 541. In addition, the display device may further include a first insulating layer 550 and a second insulating layer 560 disposed on the sensing area TCA.

The substrate 100 may include a material having a rigid characteristic, such as glass, or a flexible material that may be bent, such as plastic or polyimide. On the substrate 110, a buffer layer 111 to flatten the surface of the substrate 110 and block impurities from penetrating into the semiconductor 131 may be further disposed. The buffer layer 111 may include an inorganic material, e.g., an inorganic insulating material such as a silicon nitride (SiNx), a silicon oxide (SiOx), or a silicon oxynitride (SiOxNy). The buffer layer 111 may be a single-layered or multi-layered structure of the material. A barrier layer (not shown) may be further disposed on the substrate 110. In this case, the barrier layer may be disposed between the substrate 110 and the buffer layer 111. The barrier layer may include an inorganic insulating material such as a silicon nitride (SiNx), a silicon oxide (SiOx), or a silicon oxynitride (SiOxNy). The barrier layer may be a single-layered or multi-layered structure of the material.

The semiconductor 131 may be disposed on the substrate 110. The semiconductor 131 may include any one of amorphous silicon, polycrystalline silicon, and an oxide semiconductor. In an embodiment, the semiconductor 131 may include a low temperature polysilicon ("LTPS") or an oxide semiconductor material including or at least one of zinc (Zn), indium (In), gallium (Ga), tin (Sn), and any combinations thereof, for example. In an embodiment, the semiconductor 131 may include indium-gallium-zinc oxide ("IGZO"). The semiconductor 131 may include a channel region, a source region, and a drain region that are classified according to whether or not impurity doping is performed. The source region and drain region may have conduction characteristics corresponding to conductors.

The gate insulating layer 120 may cover the semiconductor 131 and the substrate 110. The gate insulating layer 120 may include an inorganic insulating material such as a silicon nitride (SiNx), a silicon oxide (SiOx), or a silicon oxynitride (SiOxNy). The gate insulating layer 120 may have a single-layered or multi-layered structure of the material.

The gate electrode 124 may be disposed on the gate insulating layer 120. The gate electrode 124 may include a metal or a metal alloy such as copper (Cu), molybdenum (Mo), aluminum (Al), silver (Ag), chromium (Cr), tantalum (Ta), or titanium (Ti). The gate electrode 124 may be formed as a single layer or multiple layers. The region overlapping the gate electrode 124 in a plan view among the semiconductor 131 may be the channel region.

The first inter-insulating layer 160 may cover the gate electrode 124 and the gate insulating layer 120. The first inter-insulating layer 160 may include an inorganic insulating material such as a silicon nitride (SiNx), a silicon oxide (SiOx), or a silicon oxynitride (SiOxNy). The first inter-insulating layer 160 may have a single-layered or multi-layered structure of the material.

The source electrode 173 and the drain electrode 175 may be disposed on the first inter-insulating layer 160. The source electrode 173 and the drain electrode 175 are connected to the source region and the drain region of the semiconductor 131 through openings defined in the first inter-insulating layer 160 and the gate insulating layer 120, respectively. Accordingly, the aforementioned semiconductor 131, gate electrode 124, source electrode 173, and drain electrode 175 constitute one transistor TFT. In an embodiment, the transistor TFT may include only the source region and the drain region of the semiconductor 131 instead of the source electrode 173 and the drain electrode 175.

The source electrode 173 and the drain electrode 175 may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta). The source electrode 173 and the drain electrode 175 may be configured of a single layer or multiple layers. The source electrode 173 and drain electrode 175 in another embodiment may consist of a triple layer including an upper layer, a middle layer, and a lower layer, the upper layer and the lower layer may include titanium (Ti), and the middle layer may include aluminum (Al).

The second inter-insulating layer 180 may be disposed on the source electrode 173 and the drain electrode 175. The second inter-insulating layer 180 covers the source electrode 173, the drain electrode 175, and the first inter-insulating layer 160. The second inter-insulating layer 180 is to planarize the surface of the substrate 110 on which the transistor TFT is formed, may be an organic insulator, and may include at least one of polyimide, polyamide, acryl resin, benzocyclobutene, and phenol resin.

The pixel electrode 191 may be disposed on the second inter-insulating layer 180. The pixel electrode 191 is also referred to as an anode, and may be configured of a single layer including a transparent conductive oxide layer or a metal material, or as a multi-layer including these. The transparent conductive oxide layer may include ITO, poly-ITO, IZO, IGZO, indium tin zinc oxide ("ITZO"), etc. The metal material may include silver (Ag), molybdenum (Mo), copper (Cu), gold (Au), and aluminum (Al).

A via hole 81 exposing the drain electrode 175 may be defined in the second inter-insulating layer 180. The drain electrode 175 and the pixel electrode 191 may be physically and electrically connected through the via hole 81 of the second inter-insulating layer 180. Accordingly, the pixel electrode 191 may receive an output current to be transferred from the drain electrode 175 to the emission layer 370.

A bank layer 350 may be disposed on the pixel electrode 191 and the second inter-insulating layer 180. The bank layer 350 is also referred to as a pixel defining layer ("PDL"), and includes a pixel opening 351 overlapping at least a portion of the pixel electrode 191. In this case, the pixel opening 351 may overlap the central portion of the pixel electrode 191 and may not overlap the edge portion of the pixel electrode 191. Accordingly, the size of the pixel opening 351 may be smaller than the size of the pixel electrode 191. The bank layer 350 may partition a formation position of an emission layer 370 so that the emission layer 370 may be disposed on the portion where the upper surface of the pixel electrode 191 is exposed. The bank layer 350 may be an organic insulator including at least one of polyimide, polyamide, acryl resin, benzocyclobutene, and phenol resin. In an embodiment, the bank layer 350 may include a black pixel definition layer ("BPDL") including a black color pigment.

The emission layer 370 may be disposed within the pixel opening 351 partitioned by the bank layer 350. The emission layer 370 may include an organic material that emits light such as red, green, and blue. The emission layer 370, which emits red, green, and blue light, may include a low molecular or high molecular organic material. FIG. 3 shows the emission layer 370 as a single layer, but in reality, auxiliary layers such as an electron injection layer, an electron transport layer, a hole transport layer, and a hole injection layer may be further disposed above and below the emission layer 370, and the hole injection layer and the hole transport layer may be disposed under the emission layer 370, while the electron transport layer and the electron injection layer may be disposed on the emission layer 370.

A common electrode 270 may be disposed on the bank layer 350 and the emission layer 370. The common electrode 270 is also referred to as a cathode, and may include a transparent conductive layer including at least one of ITO, IZO, IGZO, and ITZO. In addition, the common electrode 270 may have a translucent characteristic, and in this case, may define a micro-cavity together with the pixel electrode 191. According to the micro-cavity structure, light of a predetermined wavelength is emitted upwardly due to spacing and a characteristic between both electrodes, and as a result red, green, or blue may be displayed.

An encapsulation layer 400 may be disposed on the common electrode 270. The encapsulation layer 400 may include at least one inorganic layer and at least one organic layer. In the illustrated embodiment, the encapsulation layer 400 may include a first inorganic encapsulation layer 410, an organic encapsulation layer 420, and a second inorganic encapsulation layer 430. However, this is merely one of embodiments, and the number of inorganic and organic layers constituting the encapsulation layer 400 may be variously changed. The first inorganic encapsulation layer 410, the organic encapsulation layer 420, and the second inorganic encapsulation layer 430 may be disposed in the display area DA and a part of the non-display area PA. According to the embodiment, the organic encapsulation layer 420 is formed around the display area DA, and the first inorganic encapsulation layer 410 and the second inorganic encapsulation layer 430 may be disposed up to the non-display area PA. The encapsulation layer 400 is to protect the light-emitting element LED from moisture or oxygen that may inflow from the outside, and one end of the first inorganic encapsulation layer 410 and the second inorganic encapsulation layer 430 may be in direct contact.

A buffer layer 501 may be disposed on the encapsulation layer 400. The buffer layer 501 may include the inorganic insulating layer, and the inorganic material included in the inorganic insulating layer may be at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. In an embodiment, the buffer layer 501 may be omitted.

The sensing electrode connection 541, the first sensing insulating layer 510, and a plurality of sensing electrodes 520 and 540 are disposed on the buffer layer 501. One of the first sensing electrode connection 521 and the second sensing electrode connection 541 may be disposed in the same layer as the plurality of sensing electrodes 520 and 540, and the other may be disposed in a different layer from that of the plurality of sensing electrodes 520 and 540. Hereinafter, a description is given in which the second sensing electrode connection 541 is disposed in a different layer from the plurality of sensing electrodes 520 and 540 as an example.

The sensing electrode connection 541, the first sensing insulating layer 510, and the plurality of sensing electrodes 520 and 540 may constitute the sensor. The sensors may be classified into a resistive type, a capacitive type, an electromagnetic type, an optical type, or the like. The sensor in an embodiment may be a capacitive type of sensor.

The sensing electrode connection 541 may be disposed on the buffer layer 501, and the first sensing insulating layer 510 may be disposed on the buffer layer 501 and the second sensing electrode connection 541. The first sensing insulating layer 510 may include an inorganic insulating material or an organic insulating material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of acryl-based resins, methacrylic resins, polyisoprene, vinyl resins, epoxy resins, urethane-based resins, cellulosic resins, and perylene resins.

A plurality of sensing electrodes 520 and 540 is disposed on the first sensing insulating layer 510. A plurality of sensing electrodes 520 and 540 may include a plurality of first sensing electrodes 520 and a plurality of second sensing electrodes 540. The first sensing electrodes 520 and the second sensing electrodes 540 may be electrically insulated. An opening that exposes the upper surface of the second sensing electrode connection 541 is defined in the first sensing insulating layer 510, and the second sensing electrode connection 541 is connected to the second sensing electrode 540 through the opening of the first sensing insulating layer 510 to electrically connect two second sensing electrodes 540. The first sensing electrode connection 521 connecting the first sensing electrode 520 is formed in the same layer as the first sensing electrode 520 and the second sensing electrode 540.

A plurality of sensing electrodes 520 and 540 may include a conductive material having good conductivity. In an embodiment, a plurality of sensing electrodes 520 and 540 may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), for example. A plurality of sensing electrodes 520 and 540 may be configured as a single layer or multiple layers. In this case, openings may be defined in the plurality of sensing electrodes 520 and 540 so that light emitted from the light-emitting element LED is emitted upward without interference. In an embodiment, a plurality of sensing electrodes 520 and 540 may consist of a triple layer including an upper layer, a middle layer, and a lower layer, and the upper layer and the lower layer may include titanium (Ti), while the middle layer may include aluminum (Al).

A second sensing insulating layer 530 may be disposed on a plurality of sensing electrodes 520 and 540 and the first sensing insulating layer 510. The second sensing insulating layer 530 may include an inorganic insulating material or an organic insulating material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of acryl-based resins, methacrylic resins, polyisoprene, vinyl resins, epoxy resins, urethane-based resins, cellulosic resins, and perylene resins.

The first insulating layer 550 is disposed on the second sensing insulating layer 530. The first insulating layer 550 may include a light-transmitting organic insulating material having a low refractive index. In an embodiment, the first insulating layer 550 may include at least one of acryl resin, polyimide resin, polyamide resin, and Alq3 [Tris(8-hydroxyquinolinato) aluminum], for example. The first insulating layer 550 may have a relatively smaller refractive index than a refractive index of a second insulating layer 560, which is described later. In an embodiment, the first insulating layer 550 may have a refractive index of about 1.40 to about 1.59, for example.

An opening 551 is defined in the first insulating layer 550. The second sensing insulating layer 530 is not covered by the first insulating layer 550 in the opening 551. The opening 551 of the first insulating layer 550 may overlap the pixel opening 351, on one plane seen from a direction perpendicular to the surface of substrate 100, the pixel opening 351 and the opening 551 of the first insulating layer 550 are spaced apart to have a separation distance S (refer to FIG. 7) including a first separation distance S1, and the plane size of the pixel opening 351 may be larger than the plane size of the pixel opening 351.

The separation distance S between the pixel opening 351 and the opening 551 of the first insulating layer 550 means a shortest distance between the edge of the pixel opening 351 and the edge of the opening 551. The edge of the pixel opening 351 may mean a planar shape formed by a lower point in contact with the pixel electrode 191 among the edges of the bank layer 350. The edge of opening 551 may mean a planar shape formed by a lower point in contact with the second sensing insulating layer 530 among the edges of the first insulating layer 550.

The separation distance S between the pixel opening 351 and the opening 551 of the first insulating layer 550 may not be constant depending on the positions of the pixel opening 351 and the opening 551.

The second insulating layer 560 may be disposed on the second sensing insulating layer 530 and the first insulating layer 550. The second insulating layer 560 may include a light-transmitting organic insulating material having a high refractive index. The second insulating layer 560 may have a relatively larger refractive index than a refractive index of the first insulating layer 550. In an embodiment, the second insulating layer 560 may have a refractive index of about 1.60 to about 1.80, for example.

The second insulating layer 560 may be disposed within the opening 551 of the first insulating layer 550. At this time, the second insulating layer 560 contacts the side surface of the first insulating layer 550. The second insulating layer 560 may also be disposed on the upper surface of the first insulating layer 550 so as to contact the upper surface of the first insulating layer 550.

Although not shown, a polarization layer including a line polarizer, a retarder, or the like may be further disposed on the sensing area TCA. In addition, a cover window that protects the sensing area TCA and the display area DA may be further disposed on the sensing area TCA. In this case, an adhesive layer may be further disposed between the polarization layer and the cover window.

The sensing area TCA includes the first insulating layer 550 including the opening 551 and the second insulating layer 560 disposed within the opening 551 of the first insulating layer 550, thereby improving front visibility and light-emitting efficiency of the display device. That is, at least a part of light generated from the light-emitting element LED is totally reflected at the interface between the first insulating layer 550 and the second insulating layer 560, so that the light may be condensed into the front.

Light L generated from the emission layer 370 be emitted in various directions, and is incident on the sensing area TCA with various incident angles. At this time, at least part of the light L incident on the second insulating layer 560 of the sensing area TCA is reflected at the interface between the first insulating layer 550 and the second insulating layer 560. In particular, when the incident angle of the light L incident to the second insulating layer 560 is greater than a threshold angle, the incident light L may be totally reflected at the interface of the first insulating layer 550 and the second insulating layer 560. That is, the total reflection at the interface between the first insulating layer 550 and the second insulating layer 560 may occur while the light L incident on the second insulating layer 560 having a relatively large refractive index proceeds to the first insulating layer 550 having a relatively small refractive index. Through this, the light emitted in a direction other than the direction perpendicular to the surface of the substrate 100 among the light emitted from the light-emitting element LED is totally reflected at the interface between the first insulating layer 550 and the second insulating layer 560 while passing through the first insulating layer 550 and the second insulating layer 560, thereby the light may be emitted from the front of the display device, which is a direction perpendicular to the surface.

Figure 6B:
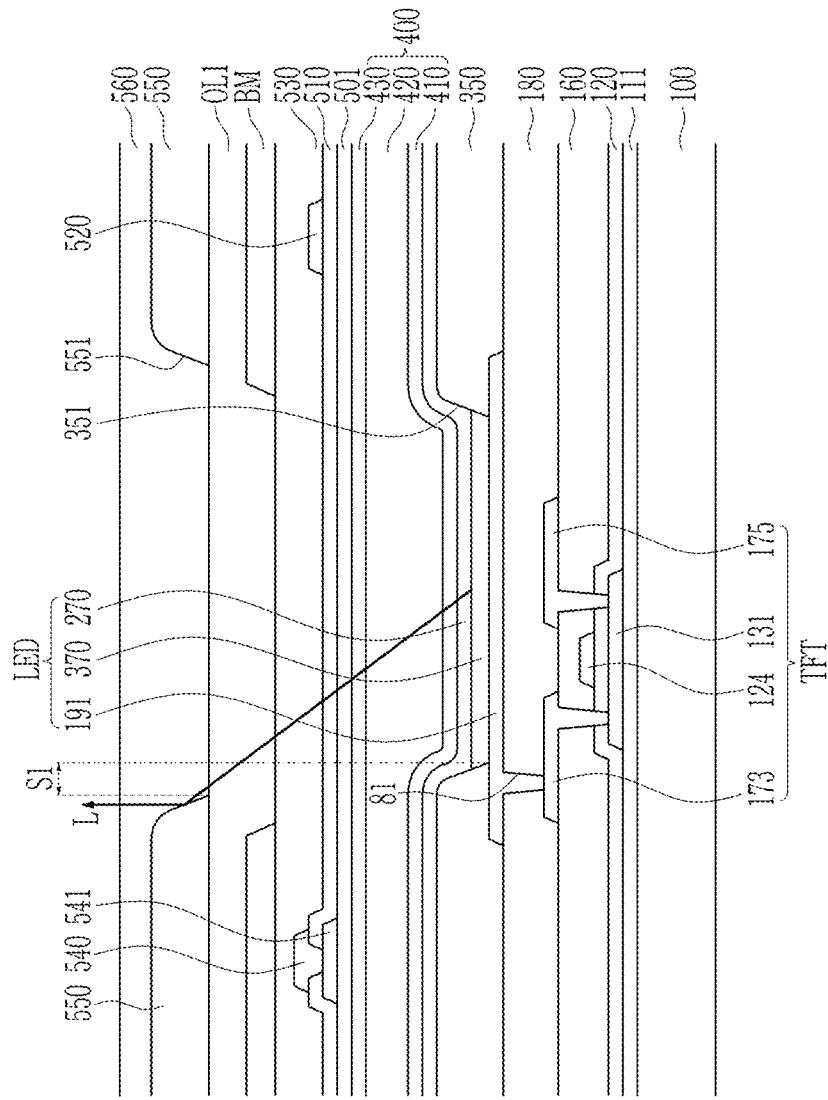
FIG. 6B is a cross-sectional view illustrating another embodiment of a portion of a display area in a display device.

Referring to FIG. 6B, the display device in the illustrated embodiment is similar to the display device in the embodiment shown in FIG. 6A. A detailed description of the same constituent elements is omitted.

Unlike the display device in the embodiment shown in FIG. 6A, the display device in the embodiment of FIG. 6B further includes a light-blocking layer BM and a reflection adjustment layer OL1 disposed on a plurality of sensing electrodes 520 and 540 of the sensing area TCA, the first sensing insulating layer 510, and the second sensing insulating layer 530.

The light-blocking layer BM may overlap at least a part of the bank layer 350.

The reflection adjustment layer OL1 may selectively absorb light of a wavelength of some band among the light reflected from inside the display device or the light incident from outside the display device. The reflection adjustment layer OL1 may fill the region where the light-blocking layer BM is not formed.

In an embodiment, the reflection adjustment layer OL1 may absorb a first wavelength region of about 490 nanometers (nm) to about 505 nm and a second wavelength region of about 585 nm to about 600 nm, so that a light transmittance in the first wavelength region and second wavelength region may be about 40% or less, for example. The reflection adjustment layer OL1 may absorb light with a wavelength outside the red, green, or blue emission wavelength range emitted from the light-emitting element LED. As such, as the reflection adjustment layer OL1 absorbs light of a wavelength that does not belong to the wavelength range of red, green, or blue emitted from the light-emitting element, it is possible to prevent or minimize the decreasing in the luminance of the display device, and simultaneously prevent or minimize the deterioration of the luminous efficiency of the display device and improve visibility.

The reflectance measured in a specular component included ("SCI") mode on the surface of the reflection adjustment layer OL1 may be less than about 10%. That is, the reflection adjustment layer OL1 absorbs external light reflection of the display device, so that the visibility may be improved. As such, the display device in the illustrated embodiment may include the reflection adjustment layer OL1 without using a polarization film to reduce external light reflection.

Figure 7:
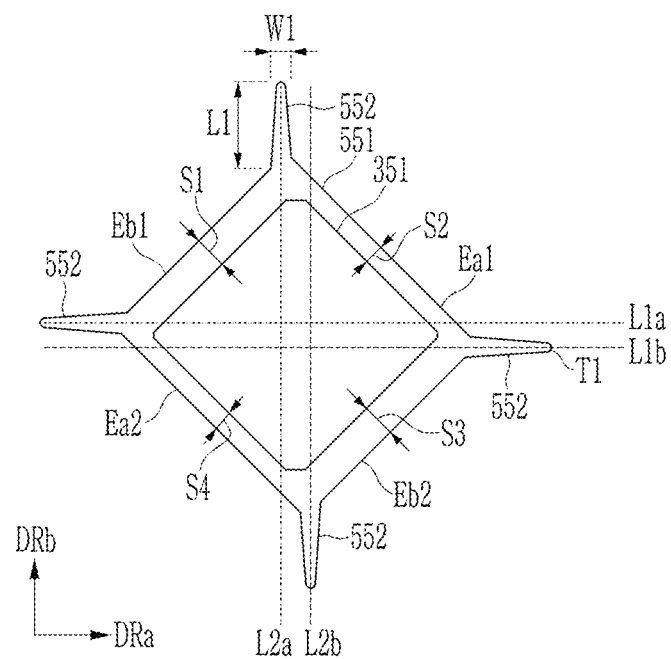
FIG. 7 is a schematic top plan view of an embodiment of a part of a display device.

Now, the pixel opening of the display device and the opening of the first insulating layer is described with reference to FIG. 7 along with FIG. 4 to FIG. 6A and FIG. 6B. FIG. 7 showing an embodiment of a part of a display device. FIG. 7 shows the pixel opening of the display device and the opening of the first insulating layer.

As shown in FIG. 7, the opening 551 of the first insulating layer 550 of the display device in an embodiment may overlap the pixel opening 351.

The pixel opening 351 may be disposed inside the opening 551 of the first insulating layer 550 in a plan view. That is, the size of the opening 551 of the first insulating layer 550 may be larger than the size of the pixel opening 351.

The pixel opening 351 may consist of approximate polygons in a plan view. In an embodiment, the pixel opening 351 may have a planar shape of approximately quadrangles in which corners are chamfered in a plan view, for example. The chamfered corner of the pixel opening 351 may be chamfered with a straight line or a curved line. The chamfered corner portion of the pixel opening 351 may have a straight-line shape. However, the planar shape of the pixel opening 351 is not limited thereto, and may be variously changed. In an embodiment, the planar shape of the pixel opening 351 may be a circle, an ellipse, or the like, for example.

The planar shape of the opening 551 of the first insulating layer 550 may be similar to the planar shape of the pixel opening 351.

The opening 551 of the first insulating layer 550 may have an approximately polygon shape including a plurality of edges Ea1, Ea2, Eb1, and Eb2 substantially parallel to the edges of the pixel opening 351 in a plan view, and may include a plurality of first extension parts 552 disposed between two edges extending in the different directions and adjacent to each other among a plurality of edges Ea1, Ea2, Eb1, and Eb2.

The edge of the pixel opening 351 may have a planar shape formed by a lower point in contact with the pixel electrode 191 among the edges of the bank layer 350, and the edge of the opening 551 may have a planar shape formed by a lower point in contact with the second sensing insulating layer 530 among the edges of the first insulating layer 550.

The opening 551 of the first insulating layer 550 may include a first edge Ea1 and a second edge Ea2 extending in the same direction and separated from each other, and a third edge Eb1 and a fourth edge Eb2 extending in a direction different from the first edge Ea1 and the second edge Ea2 and disposed to be spaced apart substantially side by side with each other.

A first interval S1 may be defined between the third edge Eb1 of the opening 551 of the first insulating layer 550 and the edge of the pixel opening 351 adjacent thereto, a second interval S2 may be defined between the first edge Ea1 of the opening 551 of the first insulating layer 550 and the edge of the pixel opening 351 adjacent thereto, a third interval S3 may be defined between the fourth edge Eb2 of the opening 551 of the first insulating layer 550 and the edge of the pixel opening 351 adjacent thereto, and a fourth interval S4 may be defined between the second edge Ea2 of the opening 551 of the first insulating layer 550 and the edge of the pixel opening 351 adjacent thereto.

The first interval S1, the second interval S2, the third interval S3, and the fourth interval S4 may not be constant. In an embodiment, the first interval S1 and the third interval S3 may be approximately equal, the second interval S2 and the fourth interval S4 may be approximately equal, and first interval S1 and the third interval S3 may be greater than the second interval S2 and the fourth interval S4, for example. The intervals S1 and S3 between the third edges Eb1 and the fourth edge Eb2 extending in the same direction and facing each other to be spaced and the edges of the pixel opening 351 adjacent thereto may be approximately the same, and the intervals S2 and S4 between the first edge Ea1 and the second edge Ea2 facing each other and the edges of the pixel opening 351 adjacent thereto may be approximately equal. In addition, separation distances S1 and S3 between the third edge Eb1 and the fourth edge Eb2 and the edges of the adjacent pixel opening 351 may be greater than separation distances S2 and S4 between the first edge Ea1 and the second edge Ea2 and the edges of the adjacent pixel openings 351.

Since the separation distance between the edges of the opening 551 of the first insulating layer 550 and the edges of the pixel opening 351 is not constant, the imaginary first line L1a and second line L1b that overlap the two first extension part 552 (also referred to as first and second sub-extension parts, respectively) extending in the direction parallel to the first direction DRa and parallel to the first direction DRa may not overlap each other. Also, the imaginary third line L2a and the fourth line L2b overlapping the two first extension parts 552 (also referred to as third and fourth sub-extension parts, respectively) extending in the direction parallel to the second direction DRb and parallel to the second direction DRb may not overlap each other.

As such, since the separation distance between the edges of the opening 551 of the first insulating layer 550 and the edges of the pixel opening 351 is not constant, it is possible to prevent variations in the light-emitting efficiency even when an error occurs in the process. The variation in the light output efficiency as the second separation distance S2 and the fourth separation distance S4 decrease is substantially the same as the variation in the light output efficiency as the first separation distance S1 and the third separation distance S3 increase, so that the light output efficiency may be compensated. That is, it is possible to prevent the variations in the light output efficiency even when an error occurs during the process.

A plurality of first extension parts 552 of the opening 551 of the first insulating layer 550 may be disposed between the first edge Ea1 and the third edge Eb1 extending in different directions, between the first edge Ea1 and the fourth edge Eb2, between the second edge Ea2 and the third edge Eb1, and between the second edge Ea2 and the fourth edge Eb2.

A plurality of first extension parts 552 may have a thin and elongated shape in which a first width W1, which is a maximum width, is shorter than a first length L1 measured along the extending direction, and the width may decrease toward the end. Each end T1 of a plurality of first extension parts 552 may have a convex curved line shape. In an embodiment, a first width W1 that is a maximum width of a plurality of first extension parts 552 may be greater than 0 micrometer (p) and less than about 4 for example.

The material constituting the second insulating layer 560 stacked on the first insulating layer 550 may extend well to the edges and the corners of the opening 551 by the plurality of first extension parts 552 of the opening 551 of the first insulating layer 550.

Figure 8:
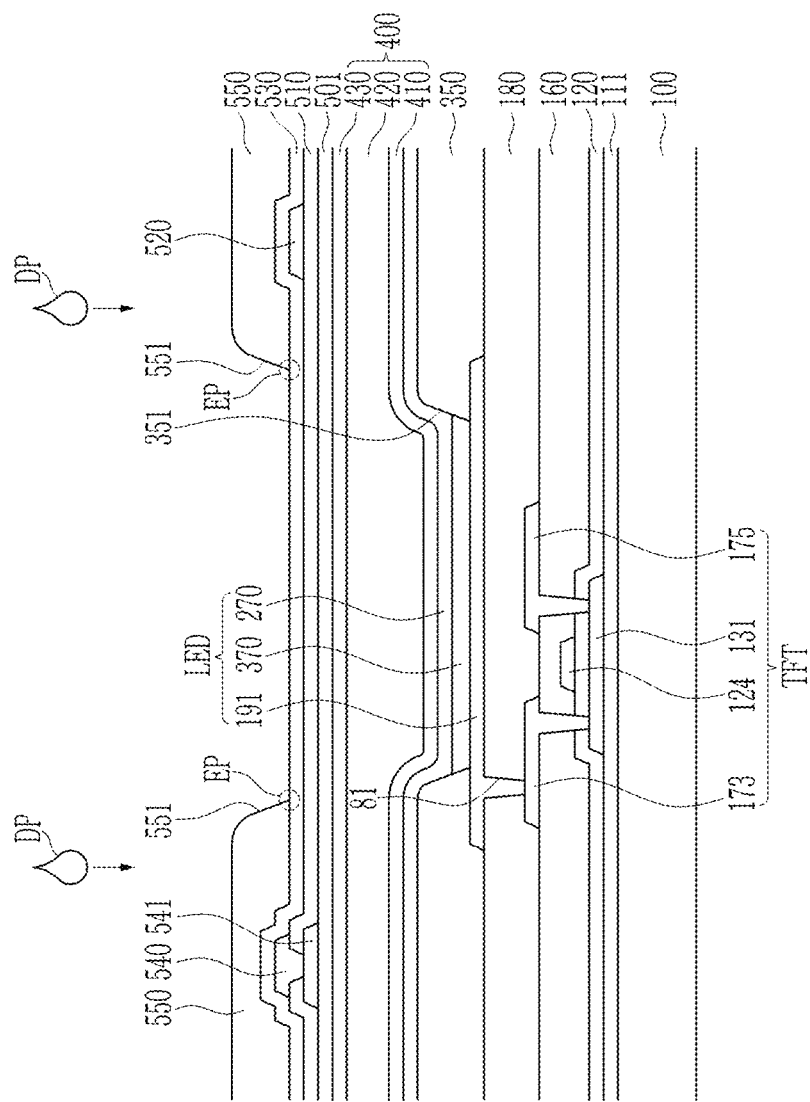
FIG. 8 is a cross-sectional view showing an embodiment of a portion of a manufacturing method of a display device.

Now, a part of the manufacturing method of the display device in an embodiment is described with reference to FIG. 8 together with FIG. 6 and FIG. 7. FIG. 8 is a cross-sectional view showing an embodiment of a part of a manufacturing method of a display device.

Referring to FIG. 8, according to the manufacturing method of the display device in an embodiment, after forming the first insulating layer 550 defining the opening 551, the second insulating layer 560 may be formed by dripping and curing a droplet DP of the material constituting the second insulating layer 560.

At this time, the droplet DP dripped on the surface of the first insulating layer 550 may move toward the opening 551 of the first insulating layer 550 and fill the opening 551 of the first insulating layer 550, however, when a plurality of first extension parts 552 is not formed in the opening 551 of the first insulating layer 550, the ends EP of a plurality of edges Ea1, Ea2, Eb1, and Eb2 of the opening 551 of the first insulating layer 550, particularly the corner between two adjacent edges extending in different directions, is not sufficiently filled with the dripped droplet DP.

As such, the material for forming the second insulating layer may not be disposed on the edge of the opening 551 of the first insulating layer 550, and thereby the second insulating layer may not be uniformly formed on the substrate as a whole. In order to uniformly form the second insulating layer, a method of forming a thick second insulating layer by increasing the dripping amount of the droplet DP may be considered, but this may increase the thickness of the display device. In addition, other problems may occur in the post process, and there are problems such as a deterioration of an impact characteristic when being applied to a foldable product.

However, according to the display device in the illustrated embodiment, the opening 551 of the first insulating layer 550 may include a plurality of first extension parts 552 extending in the different directions and disposed between two adjacent edges among a plurality of edges Ea1, Ea2, Eb1, and Eb2, and a plurality of first extension parts 552 may have a thin and elongated shape in which the width W1 is shorter than the length L1. A plurality of first extension parts 552 of the opening 551 of the first insulating layer 550 having such the thin and elongated shape may function to spread the material layer constituting the dripped second insulating layer 560 like a capillary tube toward the edge of the opening 551 of the first insulating layer 550.

Therefore, according to the display device in the illustrated embodiment, the material for forming the second insulating layer may be uniformly disposed within a plurality of opening 551 of the first insulating layer 550, thereby uniformly forming the second insulating layer with a thin thickness. In this way, it is possible to reduce the overall thickness of the display device, to solve problems occurring in the post-process, and to be used stably in foldable products.

According to the display device in the illustrated embodiment, when the thickness of the first insulating layer 550 is about 2 micrometers (μm) to about 4 μm, more specifically about 2.3 μm to about 3.5 μm, the thickness of the second insulating layer 560 may be about 9 μm to about 11 μm, and in this case, the second insulating layer 560 is not non-uniformly filled within the opening of the first insulating layer 550, so that the surface of the second insulating layer 560 may be flat. In general, unlike the display device in the illustrated embodiment, in a case that the opening 551 of the first insulating layer 550 does not include the extension part 552, when the thickness of the first insulating layer 550 is about 2 μm to about 4 μm, in more detail, about 2.3 μm to about 3.5 μm, the thickness of the second insulating layer 560 must be about 25 μm or more so that the second insulating layer 560 is not filled non-uniformly within the opening of the first insulating layer 550 and the surface of the second insulating layer 560 may be flat.

A capillary pressure (Pc) may be defined by a following equation.

$$Pc = \gamma\left(\frac{1}{Rx} + \frac{1}{Ry}\right)$$

Here, γ denotes surface tension, Rx denotes a variable related to a shape of a part filled with a liquid, e.g., a value that increases as it approaches a circle, and Ry denotes a value that increases as a depth of a part filled with a liquid increases.

Accordingly, the closer the portion filled with the liquid is, the less the capillary pressure is, and thereby the liquid is difficult to fill. That is, as the shape of the opening of the first insulating layer is closer to a circular shape, the material for forming the second insulating layer may not be uniformly filled in the opening.

Figure 9:
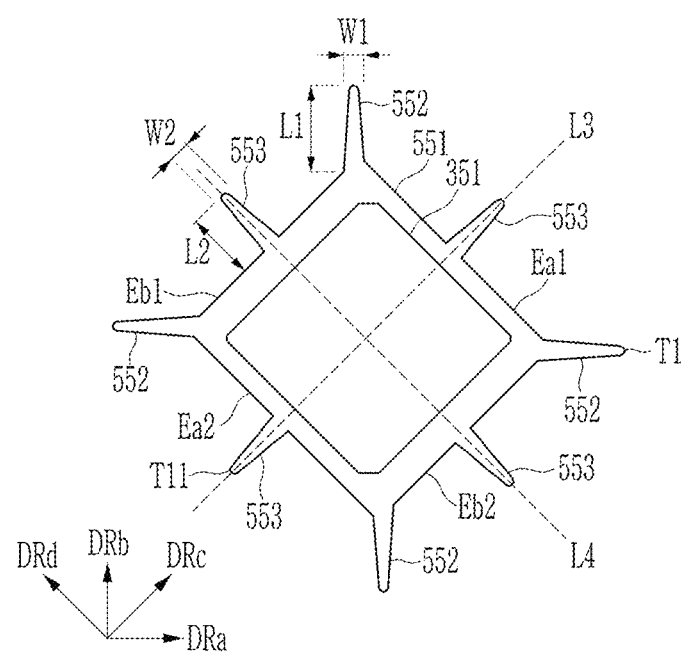
FIG. 9 is a cross-sectional view showing another embodiment of a portion of a display area in a display device.

Now, another embodiment is described with reference to FIG. 9. FIG. 9 is a cross-sectional view showing another embodiment of a part of a display area in a display device.

Referring to FIG. 9, the planar shape of the opening 551 of the first insulating layer 550 of the display device in the illustrated embodiment is substantially similar to the planar shape of the opening 551 of the first insulating layer 550 of the display device in the embodiment described with reference to FIG. 7.

The planar shape of the opening 551 of the first insulating layer 550 is similar to the planar shape of the pixel opening 351, and the opening 551 of the first insulating layer 550 may have a substantially polygonal shape including a plurality of edges Ea1, Ea2, Eb1, and Eb2 substantially parallel to the edge of the pixel opening 351 in a plan view and may include a plurality of first extension parts 552 extending in different directions among a plurality of edges Ea1, Ea2, Eb1, and Eb2 and disposed between two adjacent edges.

However, unlike the opening 551 of the first insulating layer 550 of the display device in the embodiment described with reference to FIG. 7 above, the opening 551 of the first insulating layer 550 of the display device in the illustrated embodiment may further include a plurality of second extension parts 553 extending from a center portion of a plurality of edges Ea1, Ea2, Eb1, and Eb2.

A plurality of first extension parts 552 may have a thin and elongated shape in which a first width W1, which is a maximum width, is shorter than a first length L1 measured along the extending direction, and the width may decrease toward the end. Similarly, a plurality of second extension parts 553 may have a thin and elongated shape in which a second width W2, which is a maximum width, is shorter than a second length L2 measured along the extending direction, and the width may decrease toward the end. In an embodiment, a first width W1 that is a maximum width of a plurality of first extension parts 552 and a second width W2 that is a maximum width of a plurality of second extension parts 553 may be greater than 0 μm and less than about 4 μm, for example. Each end T1 of a plurality of first extension parts 552 and each end T11 of a plurality of second extension parts 553 may have a convex curved line shape.

As described with reference to FIG. 7, the imaginary first line L1a and second line L1b that overlap two first extension parts 552 extending in the direction parallel to the first direction DRa and parallel to the first direction DRa may not overlap each other. Also, the imaginary third line L2a and fourth line L2b that overlap two first extension parts 552 extending in the direction parallel to the second direction DRb and parallel to the second direction DRb may not overlap each other.

However, referring to FIG. 9, two second extension parts 553 (also referred to as fifth and sixth sub-extension parts, respectively) extending in the fourth direction DRc that defines an oblique line with the first direction DRa and the second direction DRb may overlap the imaginary fifth line L3 extending in the fourth direction, and two second extension parts 553 (also referred to as seventh and eighth sub-extension parts, respectively) extending in a fifth direction DRd different from the fourth direction DRc and defining an oblique line with the first direction DRa and the second direction DRb may overlap an imaginary sixth line L4 that extends in the fifth direction DRd. That is, two second extension parts 553 extending in the fourth direction DRc may lie on a substantially straight line, and two second extension parts 553 extending in the fifth direction DRd may lie on a substantially straight line.

The edge of the opening 551 of the first insulating layer 550 including a plurality of first extension parts 552 and a plurality of second extension parts 553 may not overlap a plurality of sensing electrodes 520 and 540 of the sensing area TCA along a direction perpendicular to the surface of the substrate 100, and the first length L1 and the second length L2 of a plurality of first extension parts 552 and a plurality of second extension parts 553 may be lengths that do not overlap a plurality of sensing electrodes 520 and 540. In a plane view down on the display device from above, an interval between a portion where a plurality of edges Ea1, Ea2, Eb1, and Eb2 and a plurality of first extension parts 552 meet each other and a plurality of sensing electrodes 520 and 540 may be wider than an interval between a portion where a plurality of edges Ea1, Ea2, Eb1, and Eb2 and a plurality of second extension parts 553 meet each other and a plurality of sensing electrodes 520 and 540. Also, a second length L2 of each of a plurality of second extension parts 553 may be substantially equal to or shorter than a first length L1 of each of a plurality of first extension parts 552.

A plurality of first extension parts 552 and a plurality of second extension parts 553 of the opening 551 of the first insulating layer 550 of the display device in the illustrated embodiment have a thin and elongated shape, and a plurality of first extension parts 552 of the opening 551 of the first insulating layer 550 of the thin and elongated shape may play a role in spreading the material layer constituting the dripped second insulating layer 560 toward the corner of the edge of the opening 551 of the first insulating layer 550 like a capillary tube during the manufacturing process, and similarly, a plurality of second extension parts 553 of the opening 551 of the first insulating layer 550 of the thin and elongated shape may play a role in spreading the material layer forming the dripped second insulating layer 560 toward the edge of the opening 551 of the first insulating layer 550, such as a capillary tube during the manufacturing process.

Therefore, according to the display device in the illustrated embodiment, the material for forming the second insulating layer may be uniformly disposed within a plurality of openings 551 of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment described with reference to previously described FIG. 4 to FIG. 8 are applicable to the display device in the embodiment of FIG. 9.

Figure 10:
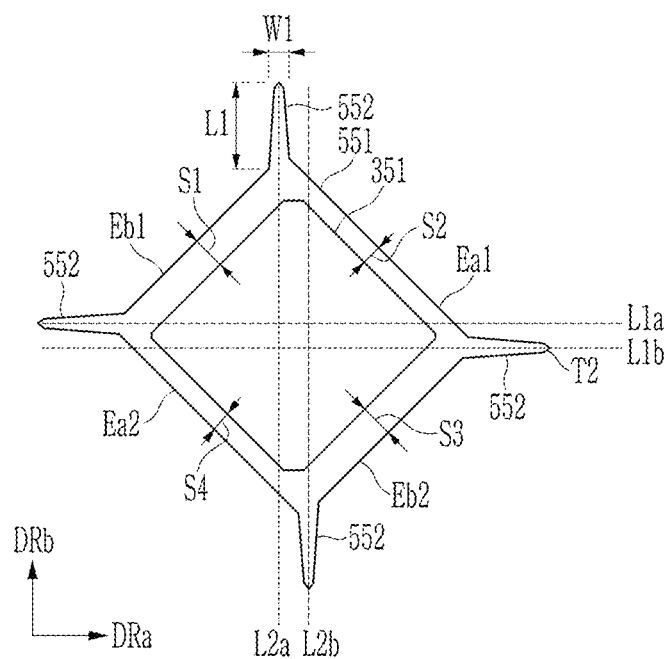
FIG. 10 is a cross-sectional view showing another embodiment of a portion of a display area in a display device.

Now, the display device in another embodiment is described with reference to FIG. 10. FIG. 10 is a cross-sectional view showing another embodiment of a part of a display area in a display device.

Referring to FIG. 10, the planar shape of the opening 551 of the first insulating layer 550 of the display device in the illustrated embodiment is substantially similar to the planar shape of the opening 551 of the first insulating layer 550 of the display device in the embodiment described with reference to FIG. 7 above.

The planar shape of the opening 551 of the first insulating layer 550 is similar to the planar shape of the pixel opening 351, and the opening 551 of the first insulating layer 550 may have a substantially polygonal shape including a plurality of edges Ea1, Ea2, Eb1, and Eb2 substantially parallel to the edge of the pixel opening 351 in a plan view and include a plurality of first extension parts 552 extending in different directions among a plurality of edges Ea1, Ea2, Eb1, and Eb2 and disposed between two adjacent edges.

However, unlike the opening 551 of the first insulating layer 550 of the display device in the embodiment described with reference to FIG. 7 above, the end T2 of a plurality of first extension parts 552 of the opening 551 of the first insulating layer 550 of the display device in the illustrated embodiment may have a sharper shape toward the end.

Similar to the opening 551 of the first insulating layer 550 of the display device in the embodiment described with reference to FIG. 7 above, a plurality of first extension parts 552 may have a thin and elongated shape in which a first width W1, which is a maximum width, is shorter than a first length L1 measured along the extending direction, and the width may decrease toward the end. A plurality of first extension parts 552 of the opening 551 of the first insulating layer 550 of the display device in the illustrated embodiments has the thin and elongated shape, and a plurality of first extension parts 552 of the opening 551 of the first insulating layer 550 of the thin and elongated shape may play a role in spreading the material layer constituting the dripped second insulating layer 560 toward the corner of the edge of the opening 551 of the first insulating layer 550 like a capillary tube during the manufacturing process.

Therefore, according to the display device in the illustrated embodiment, the material for forming the second insulating layer may be uniformly disposed within a plurality of openings 551 of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment previously described with reference to FIG. 4 to FIG. 8 are applicable to the display device in the embodiment of FIG. 10.

Figure 11:
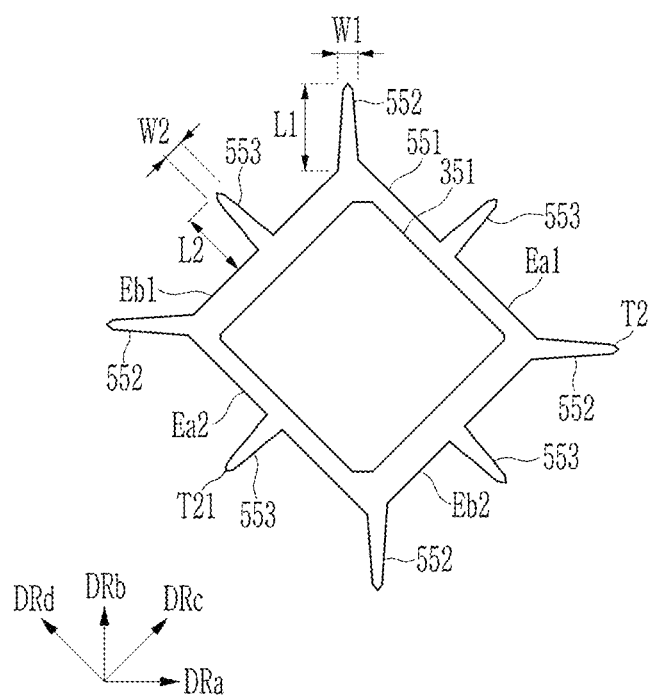
FIG. 11 is a cross-sectional view showing another embodiment of a portion of a display area in a display device.

Now, the display device in another embodiment is described with reference to FIG. 11. FIG. 11 is a cross-sectional view showing another embodiment of a part of a display area in a display device.

Referring to FIG. 11, the planar shape of the opening 551 of the first insulating layer 550 of the display device in the illustrated embodiment is substantially similar to the planar shape of the opening 551 of the first insulating layer 550 of the display device in the embodiment described with reference to FIG. 10 above.

The planar shape of the opening 551 of the first insulating layer 550 is similar to the planar shape of the pixel opening 351, and the opening 551 of the first insulating layer 550 may have a substantially polygonal shape including a plurality of edges Ea1, Ea2, Eb1, and Eb2 substantially parallel to the edge of the pixel opening 351 in a plan view and include a plurality of first extension parts 552 extending in different directions among a plurality of edges Ea1, Ea2, Eb1, and Eb2 and disposed between two adjacent edges.

However, unlike the opening 551 of the first insulating layer 550 of the display device in the embodiment described with reference to FIG. 10 above, the opening 551 of the first insulating layer 550 of the display device in the illustrated embodiment may further include a plurality of second extension parts 553 extending from the center part of a plurality of edges Ea1, Ea2, Eb1, and Eb2.

A plurality of first extension parts 552 may have a thin and elongated shape in which a first width W1, which is a maximum width, is shorter than a first length L1 measured along the extending direction, and the width may decrease toward the end. Similarly, a plurality of second extension parts 553 may have a thin and elongated shape in which a second width W2, which is a maximum width, is shorter than a second length L2 measured along the extending direction, and the width may decrease toward the end.

Each end T2 of a plurality of first extension parts 552 and each end T21 of a plurality of second extension parts 553 may have a sharper shape toward the end.

A plurality of first extension parts 552 and a plurality of second extension parts 553 of the opening 551 of the first insulating layer 550 of the display device in the illustrated embodiment have a thin and elongated shape, and a plurality of first extension parts 552 of the opening 551 of the first insulating layer 550 of the thin and elongated shape and a plurality of second extension parts 553 of the opening 551 of the first insulating layer 550 may play a role in spreading the material layer constituting the dripped second insulating layer 560 toward the edge of the opening 551 of the first insulating layer 550 like a capillary tube during the manufacturing process.

Therefore, according to the display device in the illustrated embodiment, the material for forming the second insulating layer may be uniformly disposed within a plurality of openings 551 of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment previously described with reference to FIG. 4 to FIG. 8 are applicable to the display device in the embodiment of FIG. 11.

Figure 12:
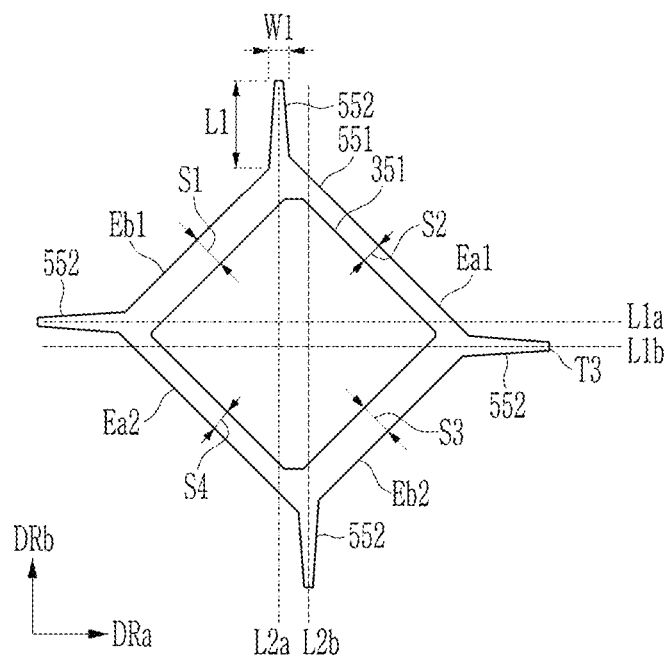
FIG. 12 is a cross-sectional view showing another embodiment of a portion of a display area in a display device.

Now, the display device in another embodiment is described with reference to FIG. 12. FIG. 12 is a cross-sectional view showing another embodiment of a part of a display area in a display device.

Referring to FIG. 12, the planar shape of the opening 551 of the first insulating layer 550 of the display device in the illustrated embodiment is substantially similar to the planar shape of the opening 551 of the first insulating layer 550 of the display device in the embodiment described with reference to FIG. 7 above.

The planar shape of the opening 551 of the first insulating layer 550 is similar to the planar shape of the pixel opening 351, and the opening 551 of the first insulating layer 550 may have a substantially polygonal shape including a plurality of edges Ea1, Ea2, Eb1, and Eb2 substantially parallel to the edge of the pixel opening 351 in a plan view and include a plurality of first extension parts 552 extending in different directions among a plurality of edges Ea1, Ea2, Eb1, and Eb2 and disposed between two adjacent edges.

However, unlike the opening 551 of the first insulating layer 550 of the display device in the embodiment described with reference to FIG. 7 above, the end T3 of a plurality of first extension parts 552 of the opening 551 of the first insulating layer 550 of the display device in the illustrated embodiment may have a straight line shape.

A plurality of first extension parts 552 may have a thin and elongated shape in which a first width W1, which is a maximum width, is shorter than a first length L1 measured along the extending direction, and the width may decrease toward the end.

A plurality of first extension parts 552 of the opening 551 of the first insulating layer 550 of the display device in the illustrated embodiment has the thin and elongated shape, and a plurality of first extension parts 552 of the opening 551 of the first insulating layer 550 of the thin and elongated shape may play a role in spreading the material layer constituting the dripped second insulating layer 560 toward the corner of the edge of the opening 551 of the first insulating layer 550 like a capillary tube during the manufacturing process.

Therefore, according to the display device in the illustrated embodiment, the material for forming the second insulating layer may be uniformly disposed within a plurality of openings 551 of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment previously described with reference to FIG. 4 to FIG. 8 are applicable to the display device in the embodiment of FIG. 12.

Figure 13:
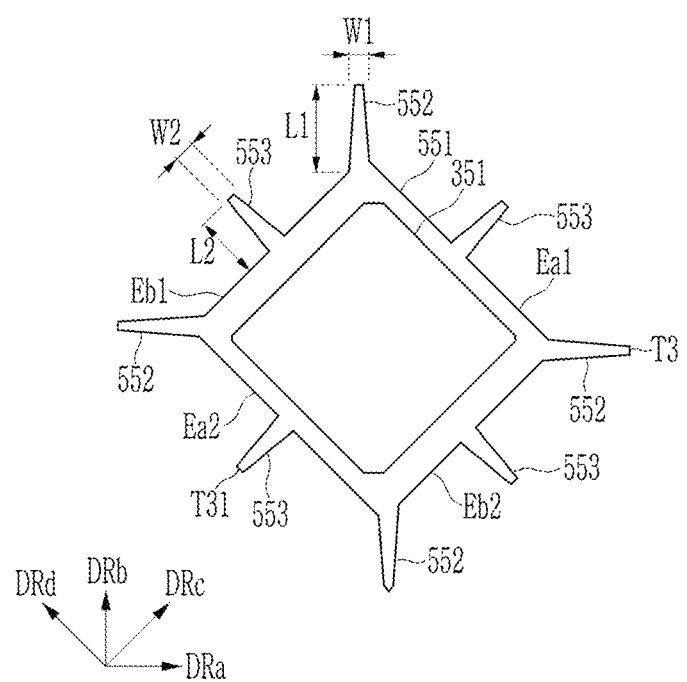
FIG. 13 is a cross-sectional view showing another embodiment of a portion of a display area in a display device.

Now, the display device in another embodiment is described with reference to FIG. 13. FIG. 13 is a cross-sectional view showing another embodiment of a part of a display area in a display device.

Referring to FIG. 13, the planar shape of the opening 551 of the first insulating layer 550 of the display device in the illustrated embodiment is substantially similar to the planar shape of the opening 551 of the first insulating layer 550 of the display device in the embodiment described with reference to FIG. 12 above.

The planar shape of the opening 551 of the first insulating layer 550 is similar to the planar shape of the pixel opening 351, and the opening 551 of the first insulating layer 550 may have a substantially polygonal shape including a plurality of edges Ea1, Ea2, Eb1, and Eb2 substantially parallel to the edge of the pixel opening 351 in a plan view and include a plurality of first extension parts 552 extending in different directions among a plurality of edges Ea1, Ea2, Eb1, and Eb2 and disposed between two adjacent edges.

However, unlike the opening 551 of the first insulating layer 550 of the display device in the embodiment described with reference to FIG. 12 above, the opening 551 of the first insulating layer 550 of the display device in the illustrated embodiment may further include a plurality of second extension parts 553 extending from the center part of a plurality of edges Ea1, Ea2, Eb1, and Eb2.

A plurality of first extension parts 552 may have a thin and elongated shape in which a first width W1, which is a maximum width, is shorter than a first length L1 measured along the extending direction, and the width may decrease toward the end. Similarly, a plurality of second extension parts 553 may have a thin and elongated shape in which a second width W2, which is a maximum width, is shorter than a second length L2 measured along the extending direction, and the width may decrease toward the end.

Each end T3 of a plurality of first extension parts 552 and each end T31 of a plurality of second extension parts 553 may have a straight-line shape.

A plurality of first extension parts 552 and a plurality of second extension parts 553 of the opening 551 of the first insulating layer 550 of the display device in the illustrated embodiment have a thin and elongated shape, and a plurality of first extension parts 552 of the opening 551 of the first insulating layer 550 of the thin and elongated shape and a plurality of second extension parts 553 of the opening 551 of the first insulating layer 550 may play a role in spreading the material layer constituting the dripped second insulating layer 560 toward the edge of the opening 551 of the first insulating layer 550 like a capillary tube during the manufacturing process.

Therefore, according to the display device in the illustrated embodiment, the material for forming the second insulating layer may be uniformly disposed within a plurality of openings 551 of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment described with reference to previously FIG. 4 to FIG. 8 are applicable to the display device in the embodiment of FIG. 13.

Figure 14:
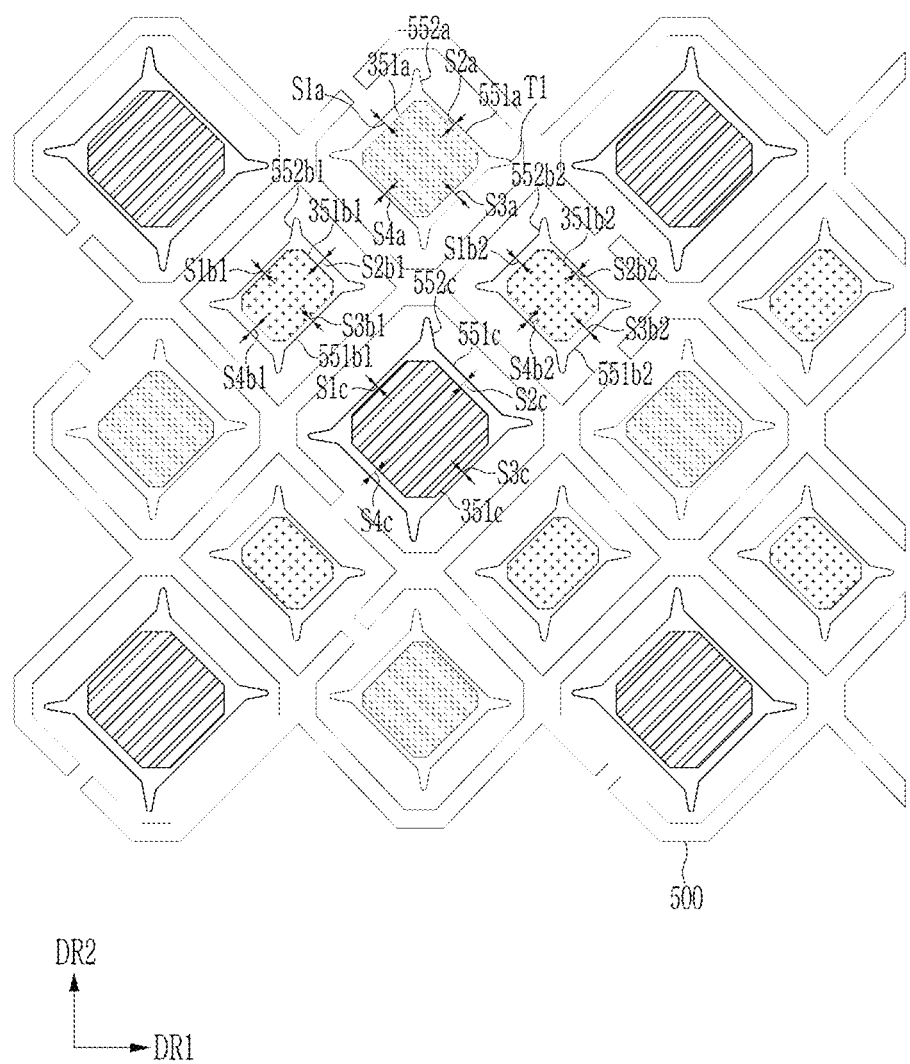
FIG. 14 is a cross-sectional view showing another embodiment of a portion of a display area in a display device.

Now, a plurality of light-emitting regions of the display device in an embodiment are described with reference to FIG. 14 together with FIG. 4 to FIG. 8. FIG. 14 is a top plan view showing an embodiment of a part of a display area in a display device.

Referring to FIG. 14, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first pixel opening 351a and the fourth pixel opening 351c may be disposed alternately along the first and second directions DR1 and DR2 that are perpendicular to each other, and the second pixel opening 351b1 and the third pixel opening 351b2 may be disposed alternately along the first and second directions DR1 and DR2.

In addition, along the first direction DR1, the first pixel opening 351a, the third pixel opening 351b2, the fourth pixel opening 351c, and the second pixel opening 351b1 may be arranged in a zigzag shape, and along the second direction DR2, the first pixel opening 351a, the second pixel opening 351b1, the fourth pixel opening 351c, and the third pixel opening 351b2 may be arranged in a zigzag shape.

One first pixel opening 351a, one fourth pixel opening 351c, one second pixel opening 351b1, and one third pixel opening 351b2 are each disposed to the upper, lower, left, and right vertex positions of an imaginary rhombus to form one dot. In this specification, the dot DOT may mean a basic unit that may display white together by emitting different primary colors as one first pixel opening 351a, one fourth pixel opening 351c, and one second pixel opening 351b1 and one third pixel opening 351b2 are disposed at the upper, lower, left, and right vertex positions of the imaginary rhombus, respectively.

The first insulating layer 550 of the display device in the illustrated embodiment may include a first opening 551a overlapping with the first pixel opening 351a, a second opening 551b1 overlapping with the second pixel opening 351b1, a third opening 551b2 overlapping with the third pixel opening 351b2, and a fourth pixel opening 551c overlapping with the fourth pixel opening 351c.

The first pixel opening 351a, the second pixel opening 351b1, the third pixel opening 351b2 and the fourth pixel opening 351c of the bank layer 350, and the first opening 551a, the second opening 551b1, the third opening 551b2, and the fourth opening 551c of the first insulating layer 550 may not overlap with a plurality of sensing electrodes 500.

Also, the first opening 551a, the second opening 551b1, the third opening 551b2, and the fourth opening 551c of the first insulating layer 550 in the display device in the illustrated embodiment may include a plurality of first extension parts 552a, 552b1, 552b2, and 552c disposed at the corner.

A plurality of first extension parts 552a, 552b1, 552b2, and 552c may have a form similar to the first extension parts 552 in the embodiment shown previously in FIG. 7. A plurality of first extension parts 552a, 552b1, 552b2, and 552c may have a thin and elongated shape having a maximum width that is shorter than a length measured along the extending direction, and a width may decrease toward the end, while each end may have a planar shape of a convex curved line. However, unlike this, a plurality of first extension parts 552a, 552b1, 552b2, and 552c may have a form similar to the first extension parts 552 in the embodiment shown in FIG. 10 or FIG. 12 above.

The openings 551a, 551b1, 551b2, and 551c of the first insulating layer 550 including a plurality of first extension parts 552a, 552b1, 552b2, and 552c may not overlap a plurality of sensing electrodes 500 on one plane when the display device is viewed from above.

A plurality of first extension parts 552a, 552b1, 552b2, and 552c of the openings 551a, 551b1, 551b2, and 551c of the first insulating layer 550 of the display device in the illustrated embodiment has a thin and elongated shape, and a plurality of first extension parts 552a, 552b1, 552b2, and 552c of a thin and elongated shape may play a role in spreading the material layer forming the dripped second insulating layer 560 toward the edge of the openings 551a, 551b1, 551b2, and 551c of the first insulating layer 550 like a capillary tube during the manufacturing process.

Therefore, according to the display device in the illustrated embodiment, the material for forming the second insulating layer may be uniformly disposed within a plurality of openings 551a, 551b1, 551b2, and 551c of the first insulating layer 550, thereby uniformly forming the second insulating layer with a thin thickness. In this way, it is possible to reduce the overall thickness of the display device, to solve problems occurring in the post-process, and to be used stably in foldable products.

The separation distance between the pixel openings 351a, 351b1, 351b2, and 351c of the bank layer 350 and the openings 551a, 551b1, 551b2, and 551c of the first insulating layer 550 may be about 0.1 µm to about 2.0 µm in a plan view.

As the separation distance between the edges of the openings 551a, 551b1, 551b2, and 551c of the first insulating layer 550 and the edges of the pixel openings 351a, 351b1, 351b2, and 351c is not constant, even when an error occurs in the process, it is possible to prevent the fluctuation of the light output efficiency from occurring. The change in the light output efficiency as the second separation distances S2a, S2b1, S2b2, and S2c and fourth separation distances S4a, S4b1, S4b2, and S4c decreases is substantially equal to the change in the light output efficiency as the first separation distances S1a, S1b1, S1b2, and S1c and third separation distances S3a, S3b1, S3b2, and S3c increases, so that the light output efficiency may be compensated. That is, it is possible to prevent variations in light output efficiency even when an error occurs during the process.

Many features of the display device in the embodiment described with reference to previously FIG. 4 to FIG. 8 are applicable to the display device in the embodiment of FIG. 14.

Figure 15:
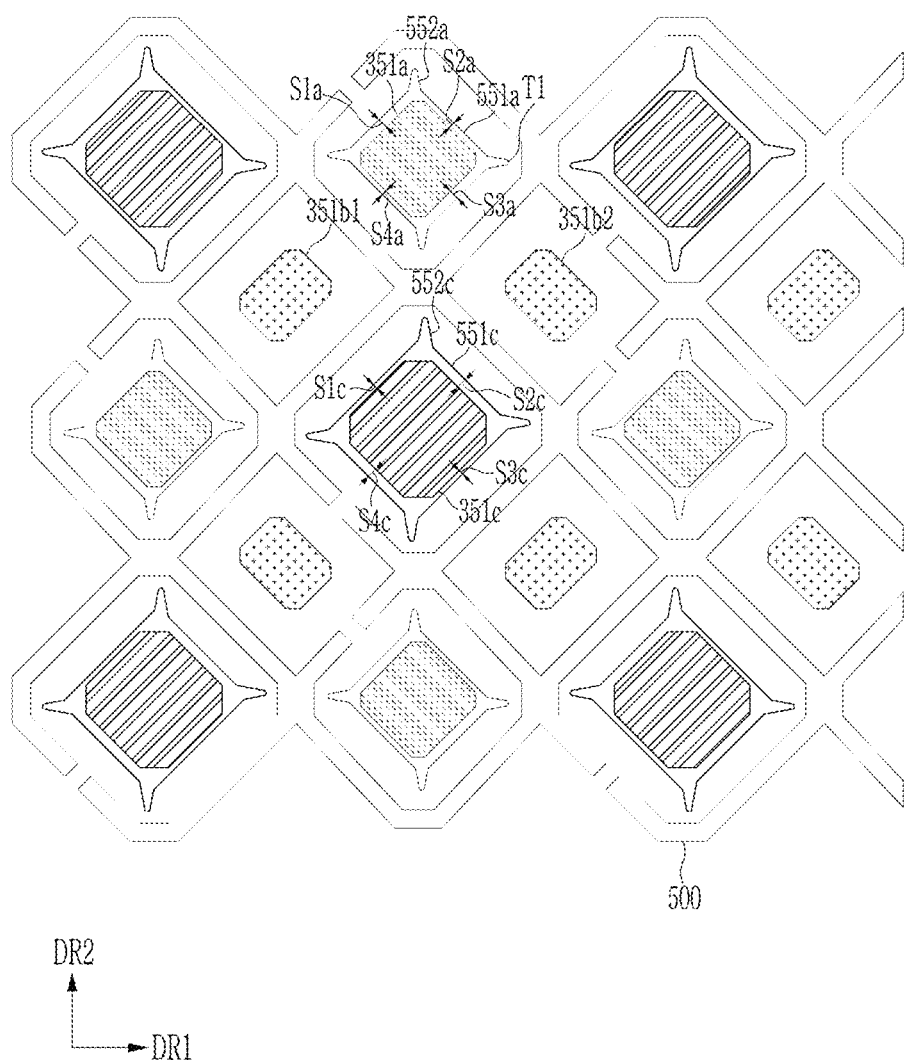
FIG. 15 is a cross-sectional view showing another embodiment of a portion of a display area in a display device.

Now, a plurality of light-emitting regions of the display device in an embodiment are described with reference to FIG. 15. FIG. 15 is a top plan view showing an embodiment of a part of a display area in a display device.

Referring to FIG. 15, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping the first pixel opening 351a and a fourth opening 551c overlapping the fourth pixel opening 351c, and unlike the display device in the embodiment described with reference to FIG. 14 above, the first insulating layer 550 may not define openings overlapping the second pixel opening 351b1 and the third pixel opening 351b2.

The size of the second pixel opening 351b1 and the third pixel opening 351b2 is smaller than the size of the first pixel opening 351a and the fourth pixel opening 351c, the difference in the length between the edge of the straight line shape and the chamfered part of the corner is not large, and they have a more circular shape compared to a shape of the first pixel opening 351a and the fourth pixel opening 351c. Therefore, when an opening overlapping the second pixel opening 351b1 and the third pixel opening 351b2 is formed in the first insulating layer 550, the opening may also have a shape close to a circular shape having a relatively small size, and during the manufacturing process, the material for forming the second insulating layer may be difficult to be disposed uniformly within the opening.

However, according to the display device in the illustrated embodiment, since the first insulating layer 550 does not define an opening overlapping the second pixel opening 351b1 and the third pixel opening 351b2, it may be difficult for the material for forming the second insulating layer to be relatively uniformly disposed, the non-uniform positioning of the material for forming the second insulating layer, which may occur within the opening of the first insulating layer 550, may be prevented, and through this, the second insulating layer may be uniformly formed with a thin thickness.

In the illustrated embodiment, the first opening 551a and the fourth pixel opening 351c of the first insulating layer 550 may include a plurality of first extension parts 552a and 552c disposed at the corners.

A plurality of first extension parts 552a and 552c may have a form similar to the first extension parts 552 in the embodiment previously shown in FIG. 7. A plurality of first extension parts 552a and 552c may have a thin and elongated shape having a maximum width shorter than a length measured along the extending direction, and a width may decrease toward the end, while each end may have a planar shape of a convex curved line. However, unlike this, a plurality of first extension parts 552a, 552b1, 552b2, and 552c may have a form similar to the first extension parts 552 in the embodiment shown in FIG. 10 or FIG. 12.

The openings 551a, 551b1, 551b2, and 551c of the first insulating layer 550 including a plurality of first extension parts 552a and 552c may not overlap a plurality of sensing electrodes 500 in a plan view when the display device is viewed from above.

A plurality of first extension parts 552a and 552c of the openings 551a and 551c of the first insulating layer 550 of the display device in the illustrated embodiment has the thin and elongated shape, and a plurality of first extension parts 552a and 552c of the thin and elongated shape may play a role in spreading the material layer constituting the dripped second insulating layer 560 toward the edge of the openings 551a and 551c of the first insulating layer 550 like a capillary tube during the manufacturing process.

Therefore, according to the display device in the illustrated embodiment, the material for forming the second insulating layer may be uniformly disposed within a plurality of opening 551a and 551c of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment described with reference to previously FIG. 4 to FIG. 8 are applicable to the display device in the embodiment of FIG. 15.

Figure 16:
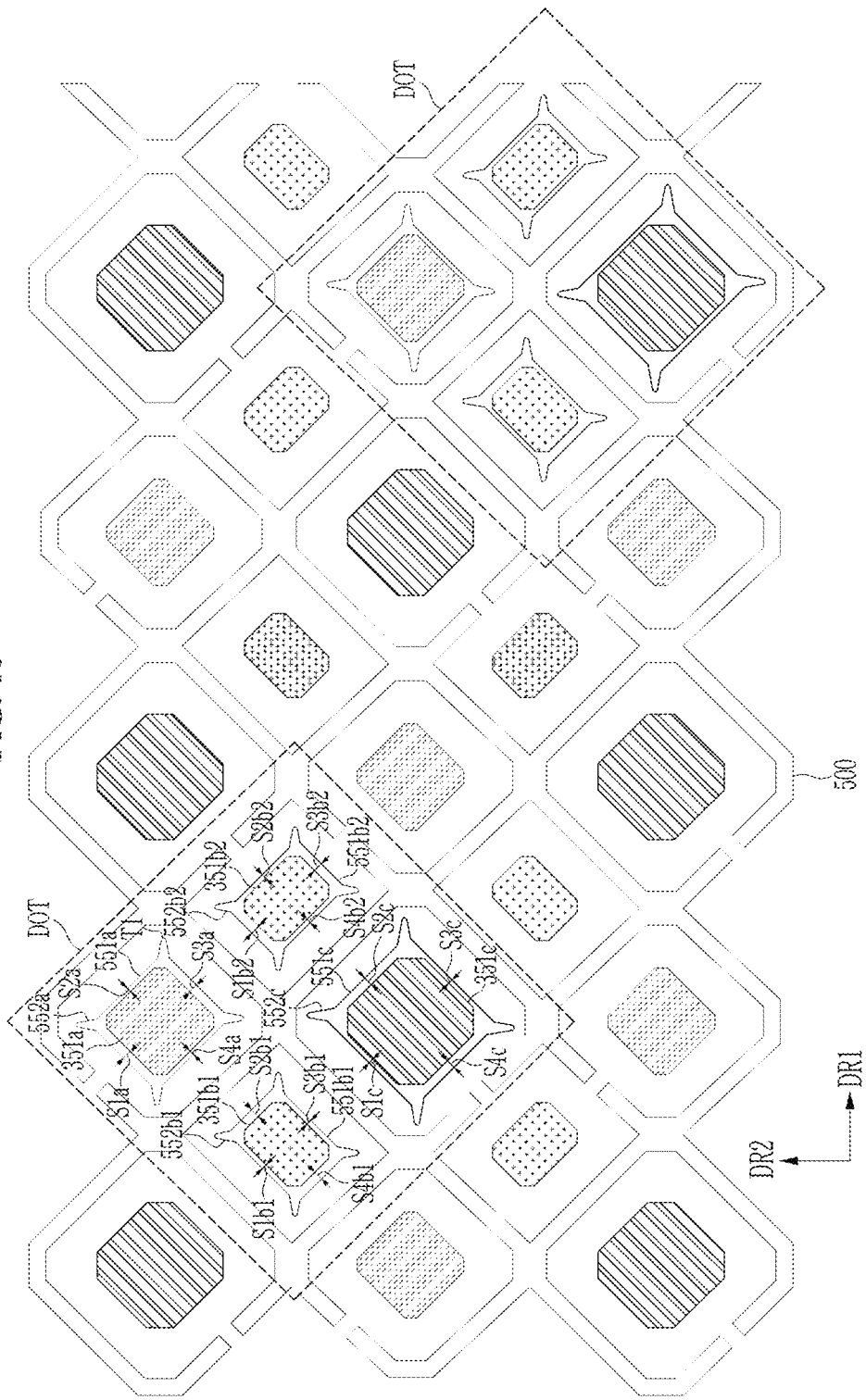
FIG. 16 is a cross-sectional view showing another embodiment of a portion of a display area in a display device.

Now, a plurality of light-emitting regions of the display device in an embodiment are described with reference to FIG. 16. FIG. 16 is a top plan view showing an embodiment of a part of a display area in a display device.

Referring to FIG. 16, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping with the first pixel opening 351a, a second opening 551b1 overlapping with the second pixel opening 351b1, a third opening 551b2 overlapping with the third pixel opening 351b2, and a fourth pixel opening 551c overlapping with the fourth pixel opening 351c.

Also, the first opening 551a, the second opening 551b1, the third opening 551b2, and the fourth opening 551c of the first insulating layer 550 in the display device in the illustrated embodiment may include a plurality of first extension parts 552a, 552b1, 552b2, and 552c disposed at the corner. A plurality of first extension parts 552a, 552b1, 552b2, and 552c may have a form similar to the first extension parts 552 in the embodiment shown previously in FIG. 7. A plurality of first extension parts 552a, 552b1, 552b2, and 552c may have a thin and elongated shape having a maximum width shorter than a length measured along the extending direction, and a width may decrease toward the end, while each end may have a planar shape of a convex curved line. However, unlike this, a plurality of first extension parts 552a, 552b1, 552b2, and 552c may have a form similar to the first extension parts 552 in the embodiment shown in FIG. 10 or FIG. 12 above.

However, according to the display device in the illustrated embodiment, unlike the display device in the embodiment shown in FIG. 14, some dots DOT among the dots DOT including one of the first pixel opening 351a, one fourth pixel opening 351c, one second pixel opening 351b1, and one third pixel opening 351b2 that position the top, bottom, left and right vertices of the imaginary rhombus define the openings 551a, 551b1, 551b2, and 551c and include a plurality of first extension parts 552a, 552b1, 552b2, and 552c of the first insulating layer 550, but some dots do not define the openings 551a, 551b1, 551b2, and 551c and do not include a plurality of first extension parts 552a, 552b1, 552b2, and 552c of the first insulating layer 550.

As above-described, the dot DOT may mean a basic unit that may display white together by emitting different primary colors as one first pixel opening 351a, one fourth pixel opening 351c, one second pixel opening 351b1, and one third pixel opening 351b2 are disposed at the upper, lower, left, and right vertex positions of the imaginary rhombus, respectively.

As such, by positioning the openings 551a, 551b1, 551b2, and 551c of the first insulating layer 550 and a plurality of first extension parts 552a, 552b1, 552b2, and 552c only in some dots, during the manufacturing process, the entire number of the openings of the first insulating layer 550 filled with the material for forming the second insulating layer is reduced, so that the positions of the material for forming the second insulating layer that may be non-uniformly formed within the opening of the first insulating layer 550 may be reduced. Through this, the second insulating layer may be uniformly formed with a thin thickness.

Also, in some dots, the openings 551a, 551b1, 551b2, and 551c of the first insulating layer 550 overlapping the pixel openings 351a, 351b1, 351b2, and 351c are disposed, and the second insulating layer 560 is disposed within the openings 551a, 551b1, 551b2, and 551c, so at least a part of light generated from the light-emitting element LED is totally reflected at the interface between the first insulating layer 550 and the second insulating layer 560, so that the light may be condensed into the front.

The separation distance between the pixel openings 351a, 351b1, 351b2, and 351c of the bank layer 350 and the openings 551a, 551b1, 551b2, and 551c of the first insulating layer 550 may be about 0.1 μm to about 2.0 μm in a plan view.

As the separation distance between the edges of the openings 551a, 551b1, 551b2, and 551c of the first insulating layer 550 and the edges of the pixel openings 351a, 351b1, 351b2, and 351c is not constant, even when an error occurs in the process, it is possible to prevent the fluctuation of the light output efficiency from occurring. The change in the light output efficiency as the second separation distances S2a, S2b1, S2b2, and S2c and fourth separation distances S4a, S4b1, S4b2, and S4c decreases is substantially equal to the change in the light output efficiency as the first separation distances S1a, S1b1, S1b2, and S1c and third separation distances S3a, S3b1, S3b2, and S3c increases, so that the light output efficiency may be compensated. That is, it is possible to prevent variations in the light output efficiency even when an error occurs during the process.

A plurality of first extension parts 552a, 552b1, 552b2, and 552c of the openings 551a, 551b1, 551b2, and 551c of the first insulating layer 550 of the display device in the illustrated embodiment has a thin and elongated shape, and a plurality of first extension parts 552a, 552b1, 552b2, and 552c of a thin and elongated shape may play a role in spreading the material layer forming the dripped second insulating layer 560 toward the edge of the openings 551a, 551b1, 551b2, and 551c of the first insulating layer 550 like a capillary tube during the manufacturing process.

Therefore, according to the display device in the illustrated embodiment, the material for forming the second insulating layer may be uniformly disposed within a plurality of openings 551a, 551b1, 551b2, and 551c of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment described with reference to previously FIG. 4 to FIG. 8 are applicable to the display device in the embodiment of FIG. 16.

Figure 17:
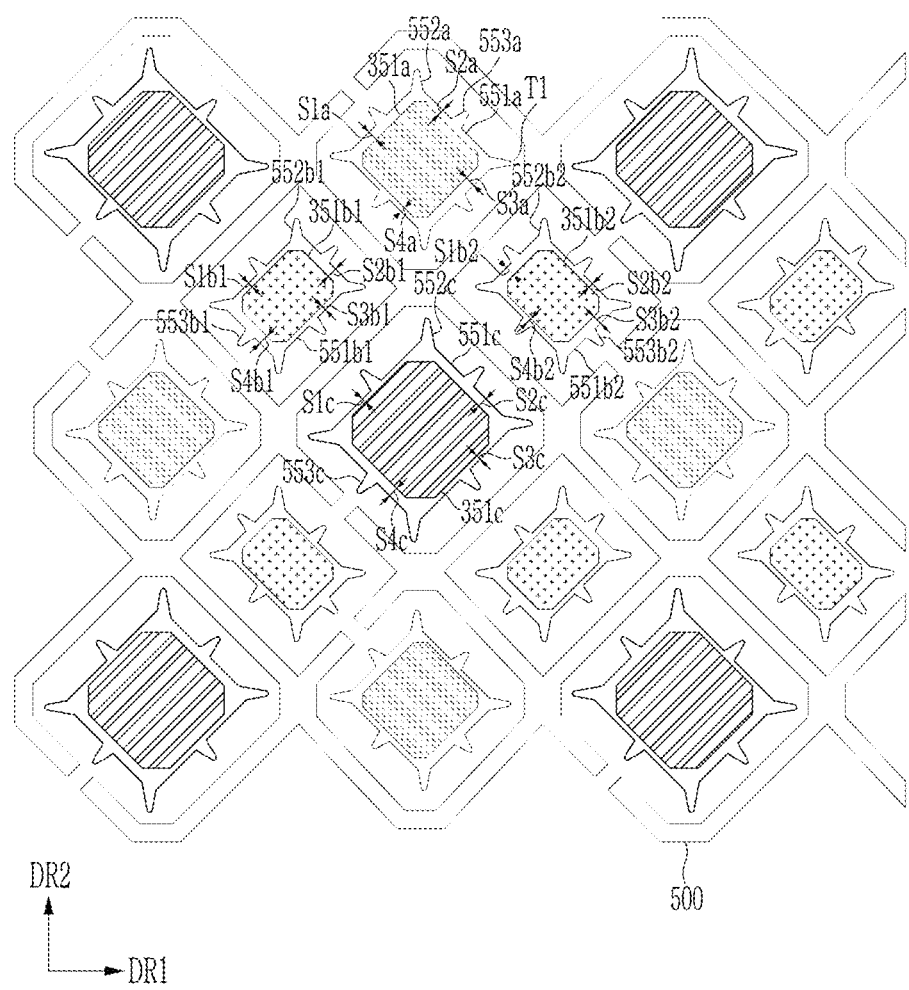
FIG. 17 is a cross-sectional view showing another embodiment of a portion of a display area in a display device.

Now, a plurality of light-emitting regions of the display device in an embodiment are described with reference to FIG. 17. FIG. 17 is a top plan view showing an embodiment of a part of a display area in a display device.

Referring to FIG. 17, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping with the first pixel opening 351a, a second opening 551b1 overlapping with the second pixel opening 351b1, a third opening 551b2 overlapping with the third pixel opening 351b2, and a fourth pixel opening 551c overlapping with the fourth pixel opening 351c.

Also, the first opening 551a, the second opening 551b1, the third opening 551b2, and the fourth opening 551c of the first insulating layer 550 in the display device in the illustrated embodiment may include a plurality of first extension parts 552a, 552b1, 552b2, and 552c disposed at the corner.

Unlike the display device in the embodiment described with reference to FIG. 14 above, the first opening 551a, the second opening 551b1, the third opening 551b2, and the fourth opening 551c of the first insulating layer 550 of the display device in the illustrated embodiment may further include a plurality of second extension parts 553a, 553b1, 553b2, and 553c disposed at the center.

A plurality of first extension parts 552a, 552b1, 552b2, and 552c and a plurality of second extension parts 553a, 553b1, 553b2, and 553c of the openings 551a, 551b1, 551b2, and 551c of the first insulating layer 550 of the display device in the illustrated embodiment may have the similar shape to a shape of the first extension parts 552 and the second extension parts 553 in the embodiment shown in FIG. 9 above. However, alternatively, a plurality of first extension parts 552a, 552b1, 552b2, and 552c and a plurality of second extension parts 553a, 553b1, 553b2, and 553c may have a form similar to the first extension parts 552 and the second extension parts 553 in the embodiment shown in FIG. 11 or FIG. 13.

As above-described, the edge of the openings 551a, 551b1, 551b2, and 551c of the first insulating layer 550 including a plurality of first extension parts 552a, 552b1, 552b2, and 552c and a plurality of second extension parts 553a, 553b1, 553b2, and 553c may not overlap a plurality of sensing electrodes 500 along a direction perpendicular to the surface of the substrate 100. The length of a plurality of first extension parts 552a, 552b1, 552b2, and 552c and the length of a plurality of second extension parts 553a, 553b1, 553b2, and 553c may be a length in which a plurality of first extension parts 552a, 552b1, 552b2, and 552c and a plurality of second extension parts 553a, 553b1, 553b2, and 553c do not overlap with a plurality of sensing electrodes 500 in a plan view viewed from above the display device. Also, a length of each of a plurality of second extension parts 553a, 553b1, 553b2, and 553c may be substantially equal to or shorter than a length of each of a plurality of first extension parts 552a, 552b1, 552b2, and 552c.

A plurality of first extension parts 552a, 552b1, 552b2, and 552c and a plurality of second extension parts 553a, 553b1, 553b2, and 553c of the openings 551a, 551b1, 551b2, and 551c of the first insulating layer 550 of the display device in the illustrated embodiment have a thin and elongated shape, and a plurality of first extension parts 552a, 552b1, 552b2, and 552c and a plurality of second extension parts 553a, 553b1, 553b2, and 553c of a thin and elongated shape may play a role in spreading the material layer forming the dripped second insulating layer 560 toward the edge of the openings 551a, 551b1, 551b2, and 551c of the first insulating layer 550 like a capillary tube during the manufacturing process.

Therefore, according to the display device in the illustrated embodiment, the material for forming the second insulating layer may be uniformly disposed within a plurality of openings 551a, 551b1, 551b2, and 551c of the first insulating layer 550, thereby uniformly forming the second insulating layer with a thin thickness. In this way, it is possible to reduce the overall thickness of the display device, to solve problems occurring in the post-process, and to be used stably in foldable products.

The separation distance between the pixel openings 351a, 351b1, 351b2, and 351c of the bank layer 350 and the openings 551a, 551b1, 551b2, and 551c of the first insulating layer 550 may be about 0.1 μm to about 2.0 μm in a plan view.

As the separation distance between the edges of the openings 551a, 551b1, 551b2, and 551c of the first insulating layer 550 and the edges of the pixel openings 351a, 351b1, 351b2, and 351c is not constant, and even when an error occurs in the process, it is possible to prevent the fluctuation of the light output efficiency from occurring. The change in the light output efficiency as the second separation distances S2a, S2b1, S2b2, and S2c and fourth separation distances S4a, S4b1, S4b2, and S4c decreases is substantially equal to the change in the light output efficiency as the first separation distances S1a, S1b1, S1b2, and S1c and the third separation distances S3a, S3b1, S3b2, and S3c increases, so that the light output efficiency may be compensated. That is, it is possible to prevent variations in the light output efficiency even when an error occurs during the process.

Many features of the display device in the embodiment previously described with reference to FIG. 4 to FIG. 8 are applicable to the display device in the embodiment of FIG. 17.

Figure 18:
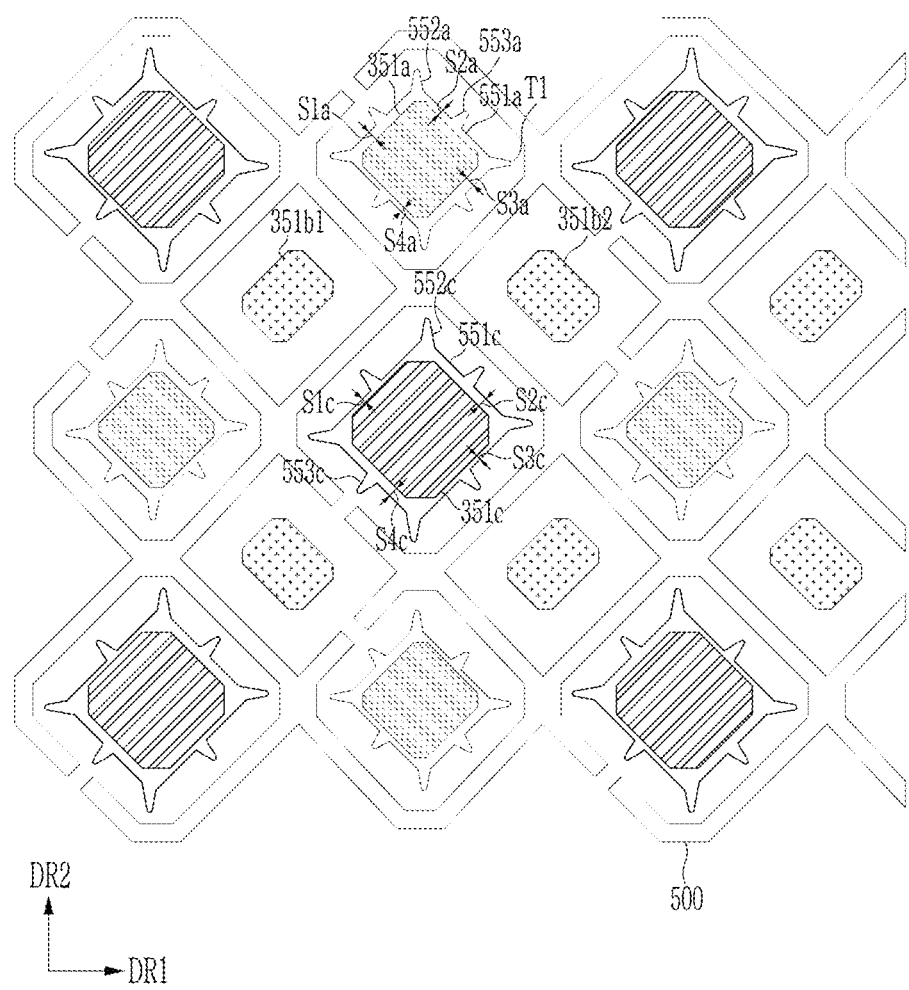
FIG. 18 is a cross-sectional view showing another embodiment of a portion of a display area in a display device.

Now, a plurality of light-emitting regions of the display device in an embodiment are described with reference to FIG. 18. FIG. 18 is a top plan view showing an embodiment of a part of a display area in a display device.

Referring to FIG. 18, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping the first pixel opening 351a and a fourth opening 551c overlapping the fourth pixel opening 351c, and unlike the display device in the embodiment described with reference to FIG. 17, an opening overlapping the second pixel opening 351b1 and the third pixel opening 351b2 may not be included.

According to the display device in the illustrated embodiment, since the first insulating layer 550 does not define an opening overlapping the second pixel opening 351b1 and the third pixel opening 351b2, which may make it difficult for the material for forming the second insulating layer to be relatively uniformly disposed, the non-uniform positioning of the material for forming the second insulating layer, which may occur within the opening of the first insulating layer 550, may be prevented, and through this, the second insulating layer may be uniformly formed with a thin thickness.

In the illustrated embodiment, the first opening 551a and the fourth pixel opening 351c of the first insulating layer 550 may include a plurality of first extension parts 552a and 552c and a plurality of second extension parts 553a and 553c disposed at the corner.

A plurality of first extension parts 552a and 552c and a plurality of second extension parts 553a and 553c may have a form similar to the first extension parts 552 and the second extension parts 553 in the embodiment shown in FIG. 9 above. However, unlike this, a plurality of first extension parts 552a and 552c and a plurality of second extension parts 553a and 553c may have the similar shape to a shape of the first extension parts 552 and the second extension parts 553 in the embodiment shown in FIG. 11 or FIG. 13.

The openings 551a, 551b1, 551b2, and 551c of the first insulating layer 550 including a plurality of first extension parts 552a and 552c and a plurality of second extension parts 553a and 553c may not overlap a plurality of sensing electrodes 500 in a plan view looking down on the display device from above.

A plurality of first extension parts 552a and 552c and a plurality of second extension parts 553a and 553c of the openings 551a and 551c of the first insulating layer 550 of the display device of the illustrated embodiment have a thin and elongated shape, and a plurality of first extension parts 552a and 552c and a plurality of second extension parts 553a and 553c of the thin and elongated shape may play a role in spreading the material layer constituting the dripped second insulating layer 560 toward the edge of the openings 551a and 551c of the first insulating layer 550.

Therefore, according to the display device in the illustrated embodiment, the material for forming the second insulating layer may be uniformly disposed within a plurality of opening 551a and 551c of the first insulating layer 550, thereby uniformly forming the second insulating layer with a thin thickness. In this way, it is possible to reduce the overall thickness of the display device, to solve problems occurring in the post-process, and to be used stably in foldable products.

Many features of the display device in the embodiment previously described with reference to FIG. 4 to FIG. 8 are applicable to the display device in the embodiment of FIG. 18.

Figure 19:
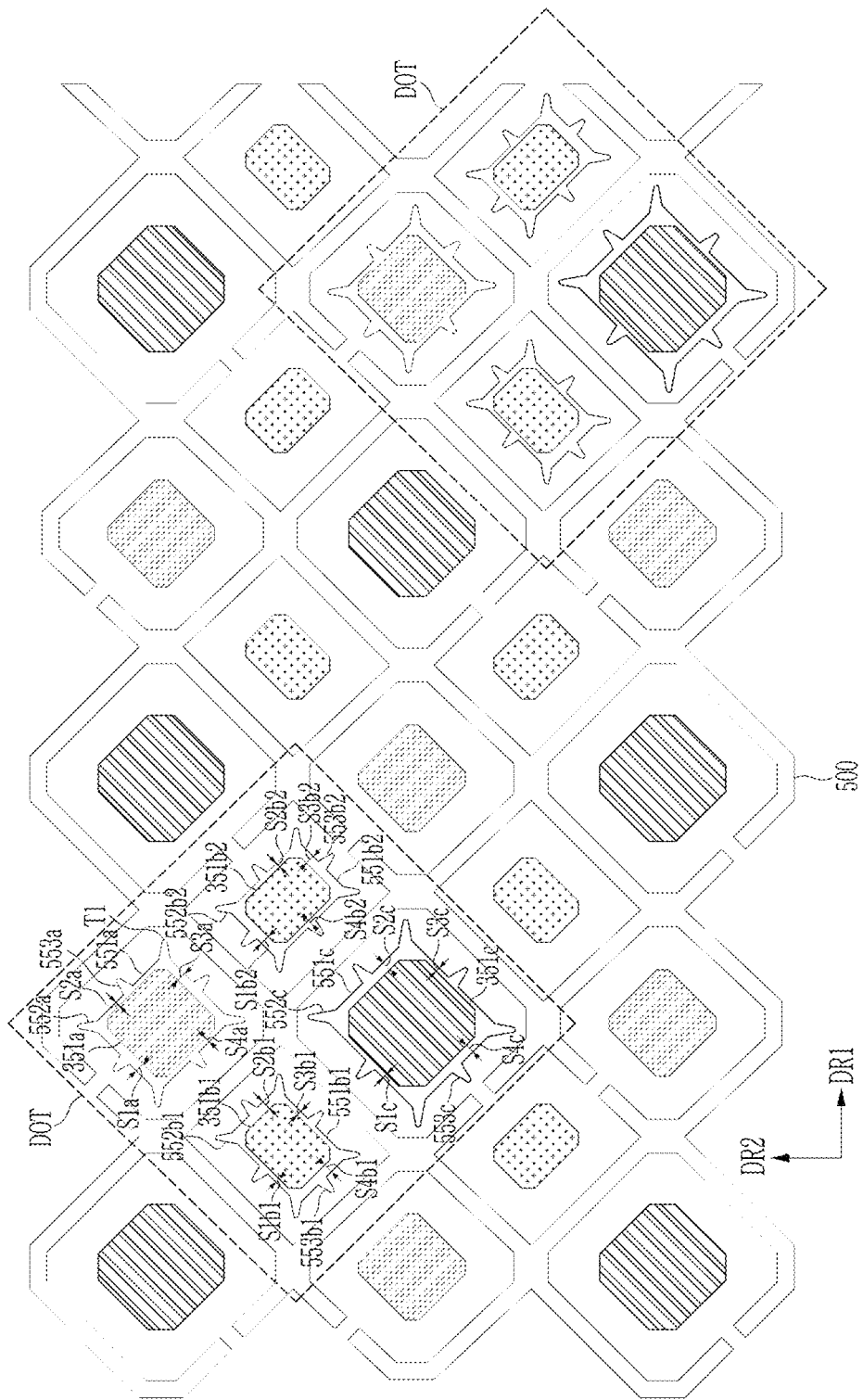
FIG. 19 is a cross-sectional view showing another embodiment of a portion of a display area in a display device.

Now, a plurality of light-emitting regions of the display device in an embodiment are described with reference to FIG. 19. FIG. 19 is a top plan view showing an embodiment of a part of a display area in a display device.

Referring to FIG. 19, the bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping with the first pixel opening 351a, a second opening 551b1 overlapping with the second pixel opening 351b1, a third opening 551b2 overlapping with the third pixel opening 351b2, and a fourth pixel opening 551c overlapping with the fourth pixel opening 351c.

Also, the first opening 551a, the second opening 551b1, the third opening 551b2, and the fourth opening 551c of the first insulating layer 550 of the display device in the illustrated embodiment may include a plurality of first extension parts 552a, 552b1, 552b2, and 552c disposed at the corners, and a plurality of second extension parts 553a, 553b1, 553b2, and 553c disposed at the center of each edge.

However, according to the display device in the illustrated embodiment, unlike the display device in the embodiment shown in FIG. 17, some dots DOT among the dots DOT including one of the first pixel opening 351a, one fourth pixel opening 351c, one second pixel opening 351b1, and one third pixel opening 351b2 that are disposed at the top, bottom, left, and right vertices of the imaginary rhombus define the openings 551a, 551b1, 551b2, and 551c and include a plurality of first extension parts 552a, 552b1, 552b2, and 552c of the first insulating layer 550, however, some dots do not define the openings 551a, 551b1, 551b2, and 551c and do not include a plurality of first extension parts 552a, 552b1, 552b2, and 552c of the first insulating layer 550.

As such, by positioning the openings 551a, 551b1, 551b2, and 551c of the first insulating layer 550 and a plurality of first extension parts 552a, 552b1, 552b2, and 552c only in some dots, during the manufacturing process, the entire number of the openings of the first insulating layer 550 filled with the material for forming the second insulating layer is reduced, so that the positions of the material for forming the second insulating layer that may be non-uniformly formed within the opening of the first insulating layer 550 may be reduced. Through this, the second insulating layer may be uniformly formed with a thin thickness.

Also, in some dots, the openings 551a, 551b1, 551b2, and 551c of the first insulating layer 550 overlapping the pixel openings 351a, 351b1, 351b2, and 351c are disposed, and the second insulating layer 560 is disposed within the openings 551a, 551b1, 551b2, and 551c, so at least a part of light generated from the light-emitting element LED is totally reflected at the interface between the first insulating layer 550 and the second insulating layer 560, so that the light may be condensed into the front.

A plurality of first extension parts 552a, 552b1, 552b2, and 552c and a plurality of second extension parts 553a, 553b1, 553b2, and 553c of the openings 551a, 551b1, 551b2, and 551c of the first insulating layer 550 of the display device in the illustrated embodiment may have the similar shape to a shape of the first extension parts 552 and the second extension parts 553 in the embodiment shown in FIG. 9 above. However, alternatively, a plurality of first extension parts 552a, 552b1, 552b2, and 552c and a plurality of second extension parts 553a, 553b1, 553b2, and 553c may have a form similar to the first extension parts 552 and the second extension parts 553 in the embodiment shown in FIG. 11 or FIG. 13.

A plurality of first extension parts 552a, 552b1, 552b2, and 552c and a plurality of second extension parts 553a, 553b1, 553b2, and 553c of the openings 551a, 551b1, 551b2, and 551c of the first insulating layer 550 of the display device in the illustrated embodiment have a thin and elongated shape, and a plurality of first extension parts 552a, 552b1, 552b2, and 552c and a plurality of second extension parts 553a, 553b1, 553b2, and 553c of a thin and elongated shape may play a role in spreading the material layer forming the dripped second insulating layer 560 toward the edge of the openings 551a, 551b1, 551b2, and 551c of the first insulating layer 550 like a capillary tube during the manufacturing process.

Therefore, according to the display device in the illustrated embodiment, the material for forming the second insulating layer may be uniformly disposed within a plurality of openings 551a, 551b1, 551b2, and 551c of the first insulating layer 550, thereby uniformly forming the second insulating layer with a thin thickness. In this way, it is possible to reduce the overall thickness of the display device, to solve problems occurring in the post-process, and to be used stably in foldable products.

The separation distance between the pixel openings 351a, 351b1, 351b2, and 351c of the bank layer 350 and the openings 551a, 551b1, 551b2, and 551c of the first insulating layer 550 may be about 0.1 μm to about 2.0 μm in a plan view.

As the separation distance between the edges of the openings 551a, 551b1, 551b2, and 551c of the first insulating layer 550 and the edges of the pixel openings 351a, 351b1, 351b2, and 351c is not constant, even when an error occurs in the process, it is possible to prevent the fluctuation of the light output efficiency from occurring. The change in the light output efficiency as the second separation distances S2a, S2b1, S2b2, and S2c and fourth separation distances S4a, S4b1, S4b2, and S4c decrease is substantially equal to the change in the light output efficiency as the first separation distances S1a, S1b1, S1b2, and S1c and third separation distance S3a, S3b1, S3b2, and S3c increases, so that the light output efficiency may be compensated. That is, it is possible to prevent variations in the light output efficiency even when an error occurs during the process.

Figure 20:
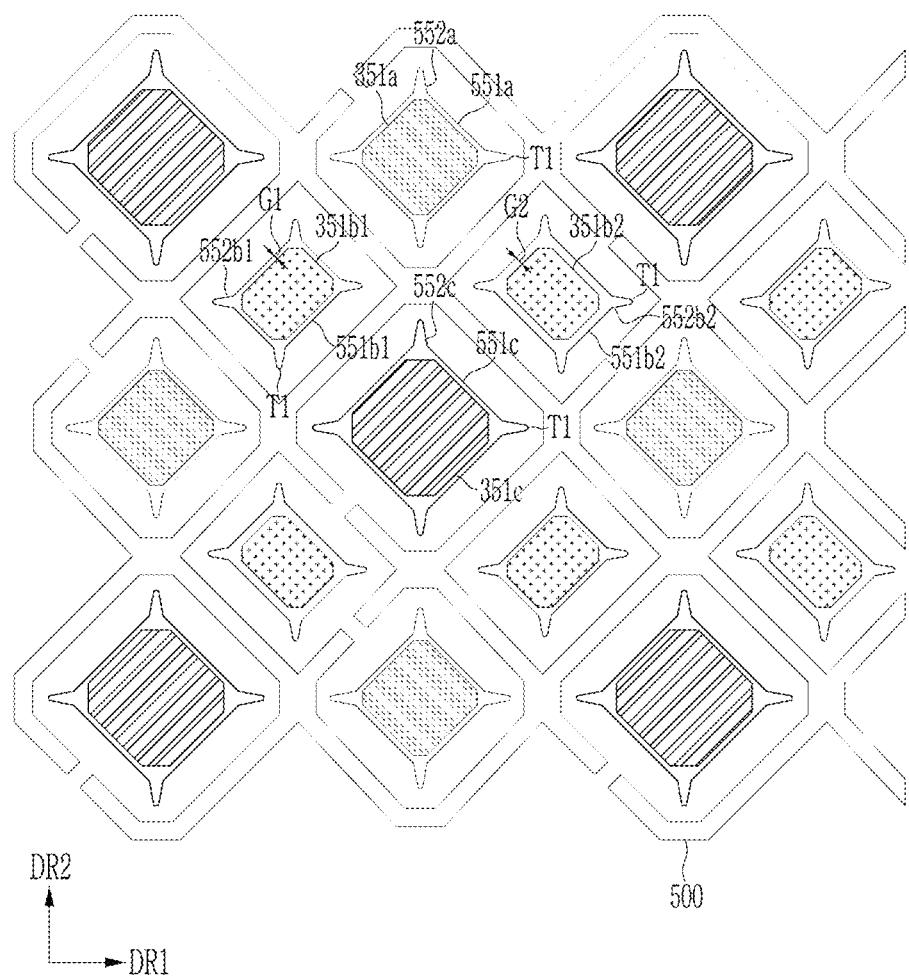
FIG. 20 is a cross-sectional view showing another embodiment of a portion of a display area in a display device.

Now, a plurality of light-emitting regions of the display device in an embodiment are described with reference to FIG. 20. FIG. 20 is a top plan view showing an embodiment of a part of a display area in a display device.

Referring to FIG. 20, the display device in the illustrated embodiment is similar to the display device in the embodiment described with reference to FIG. 14.

The bank layer 350 of the display device in the illustrated embodiment may include a first pixel opening 351a where an emission layer emitting a first color is disposed, a second pixel opening 351b1 and a third pixel opening 351b2 where an emission layer emitting a second color is disposed, and a fourth pixel opening 351c in which an emission layer emitting a third color is disposed.

The first insulating layer 550 of the display device in the illustrated embodiment may include a first opening 551a overlapping with the first pixel opening 351a, a second opening 551b1 overlapping with the second pixel opening 351b1, a third opening 551b2 overlapping with the third pixel opening 351b2, and a fourth pixel opening 551c overlapping with the fourth pixel opening 351c.

Also, the first opening 551a, the second opening 551b1, the third opening 551b2, and the fourth opening 551c of the first insulating layer 550 in the display device in the illustrated embodiment may include a plurality of first extension parts 552a, 552b1, 552b2, and 552c disposed at the corner.

A plurality of first extension parts 552a, 552b1, 552b2, and 552c of the openings 551a, 551b1, 551b2, and 551c of the first insulating layer 550 of the display device in the illustrated embodiment has a thin and elongated shape, and a plurality of first extension parts 552a, 552b1, 552b2, and 552c of a thin and elongated shape may play a role in spreading the material layer forming the dripped second insulating layer 560 toward the edge of the openings 551a, 551b1, 551b2, and 551c of the first insulating layer 550 like a capillary tube during the manufacturing process.

Therefore, according to the display device in the illustrated embodiment, the material for forming the second insulating layer may be uniformly disposed within a plurality of openings 551a, 551b1, 551b2, and 551c of the first insulating layer 550, thereby uniformly forming the second insulating layer with a thin thickness. In this way, it is possible to reduce the overall thickness of the display device, to solve problems occurring in the post-process, and to be used stably in foldable products.

However, unlike the display device in the embodiment shown in FIG. 14, according to the display device in the illustrated embodiment, the separation distance between the second pixel opening 351b1 in which the emission layer emitting the second color is disposed and the second opening 551b1 of the first insulating layer 550 may be a first interval G1, and the separation distance between the second pixel opening 351b1 in which the emission layer emitting the second color is disposed and the third opening 551b2 of the first insulating layer 550 may be a second interval G2. In the illustrated embodiment, the pixels with the first interval G1 and the second interval G2 may emit the same color. That is, a portion of a plurality of pixels emitting the same color may have the first interval G1 and a portion may have the second interval G2.

Even when the separation distance is formed narrower or wider than a design value due to a process error, since the reduced efficiency in the pixel with the first interval G1 is compensated by the increased efficiency in the pixel with the second interval G2, the efficiency deviation may be offset. Therefore, it is possible to reduce the efficiency distribution of the entire display device.

Many features of the display device in the embodiment described previously with reference to FIG. 4 to FIG. 8 are applicable to the display device in the embodiment of FIG. 20. Also, many features of the display device in the embodiment previously described with reference to FIG. 14 to FIG. 19 are applicable to the display device in the embodiment of FIG. 20.

Figure 21:
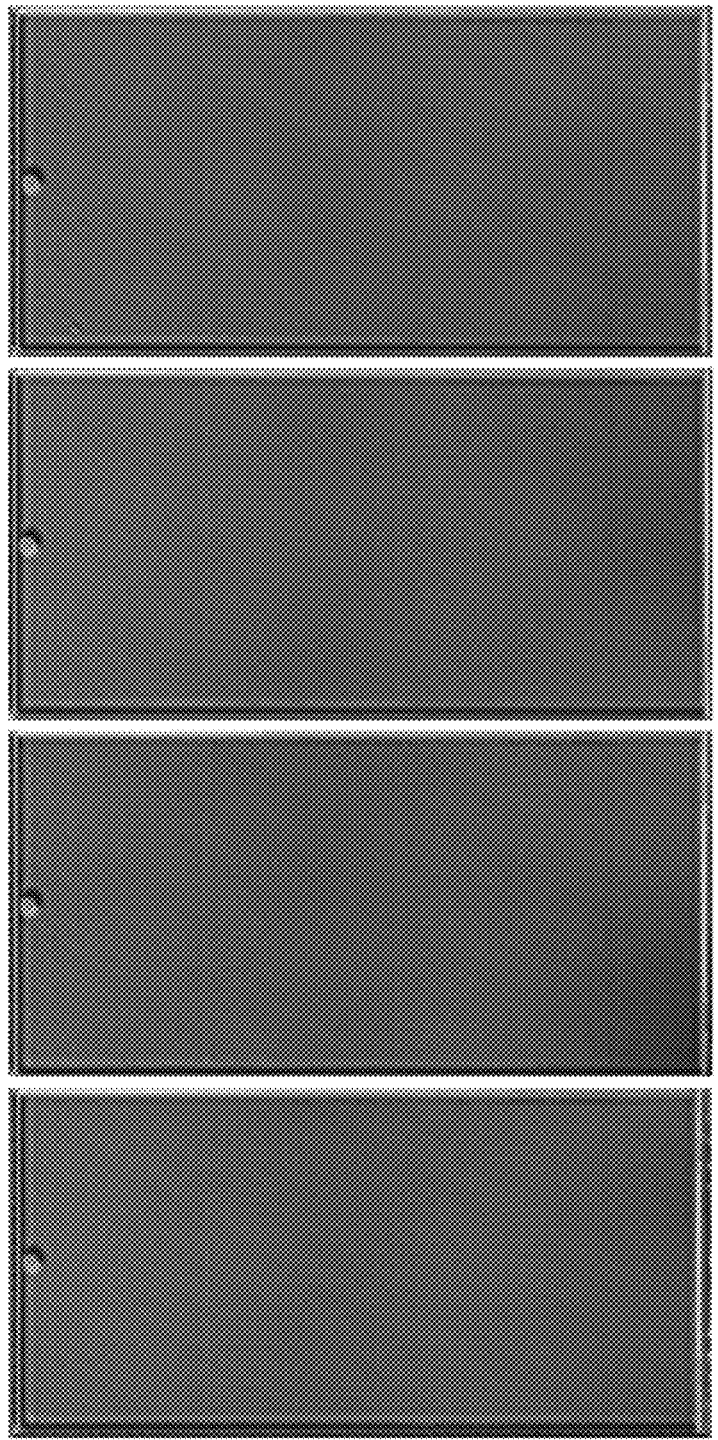
FIG. 21 is an electron micrograph showing a result of an experimental example.

Next, a result of an experimental example is described with reference to FIG. 21. FIG. 21 is an electron micrograph showing a result of an experimental example.

In this experimental example, while changing the width, the length, and the position of the first extension part and the second extension part of the opening of the first insulating layer, the second insulating layer was formed while differentiating the process conditions and the results thereof are sequentially shown in FIG. 21.

The conditions of this experimental example are shown in Table 1 below.

TABLE 1

|  | Case 1 | Case 2 | Case 3 | Case 4 |
| --- | --- | --- | --- | --- |
| Extension part width (μm) | 3 | 3 | 3 | 3 |
| Extension part length (μm) | 6 | 6 | 6 | 6 |
| Third and fourth opening | No | Yes | No | Yes |
| Second extension part | No | No | Yes | Yes |

For a first case (Case 1), a second case (Case 2), a third case (Case 3), and a fourth case (Case 4), the thickness of the first insulating layer was uniformly formed to be about 2.3 μm, and a material layer constituting the second insulating layer was stacked on the first insulating layer and exposed to form the second insulating layer having a thickness of about 9 μm. FIG. 21 sequentially shows the results of the first case (Case 1), the second case (Case 2), the third case (Case 3), and the fourth case (Case 4).

Referring to FIG. 21, even when the second insulating layer has the thickness of about 9 μm, like the display device in the embodiments, it may be confirmed that the surface of the second insulating layer is well formed to be flat in all of the first case (Case 1), the second case (Case 2), the third case (Case 3), and the fourth case (Case 4) in which the opening of the first insulating layer includes an extension part.

As such, when the opening of the first insulating layer includes the extension part like the display device in the embodiments, even when the second insulating layer has a thickness of about 9 μm to be thinner than a conventional thickness of the second insulating layer of about 25 μm, it may be confirmed that the surface of the second insulating layer was well formed flat.

Figure 22:
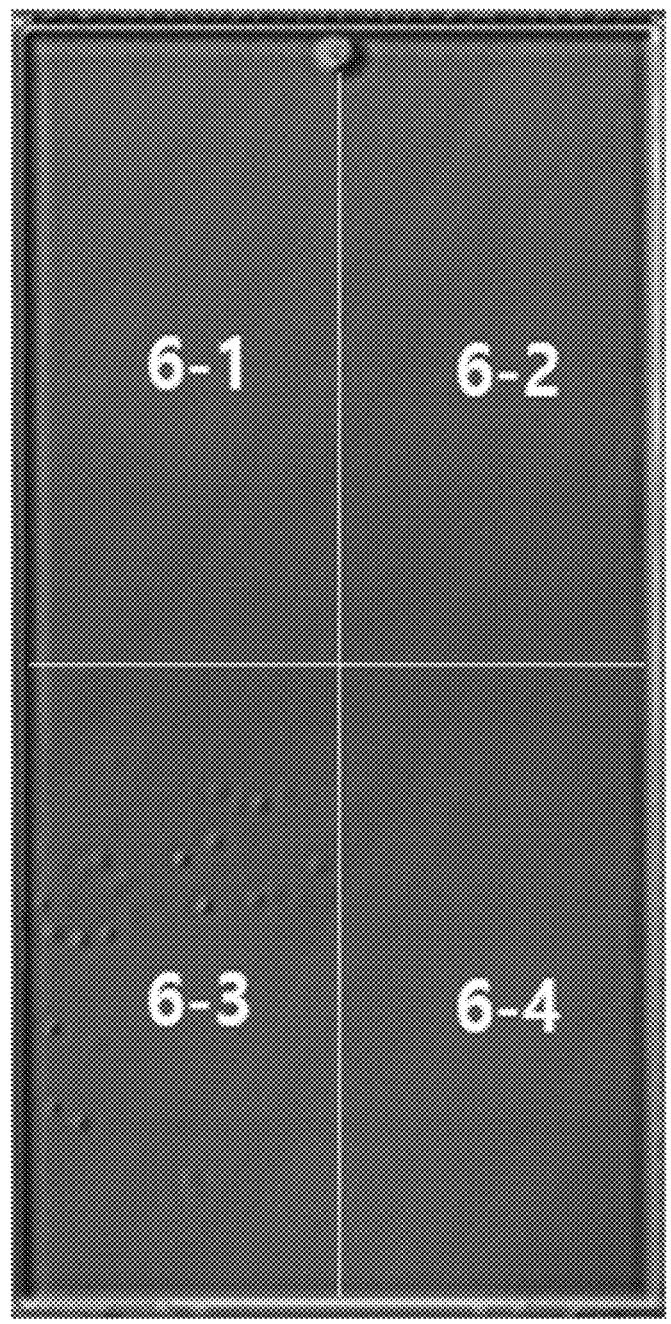
FIG. 22 is an electron micrograph showing a result of another experimental example.

Next, a result of another experimental example is described with reference to FIG. 22. FIG. 22 is an electron micrograph showing a result of another experimental example.

In this experimental example, while changing the width, the length, and the position of the first extension part and the second extension part of the opening of the first insulating layer, the second insulating layer was formed while differentiating the process conditions and the results thereof are shown in FIG. 22.

The conditions of this experimental example are shown in Table 2 below.

TABLE 2

|  | Case 5 | Case 6 | Case 7 | Case 8 |
|---|---|---|---|---|
| Extension part width (μm) | 2 | 2 | 4 | 3 |
| Extension part length (μm) | 6 | 6 | 6 | 8 |
| Third and fourth opening | Yes | Yes | No | Yes |
| Second extension part | Yes | No | No | No |

For a fifth case (Case 5), a sixth case (Case 6), a seventh case (Case 7), and an eighth case (Case 8), the thickness of the first insulating layer was uniformly formed to be about 2.3 μm, and a material layer constituting the second insulating layer was stacked on the first insulating layer and exposed to form the second insulating layer having a thickness of about 9 μm. In FIG. 22, a region 6-1 shows a result of the fifth case (Case a region 6-2 shows a result of the sixth case (Case 6), a region 6-3 shows a result of the seventh case (Case 7), and a region 6-4 shows result of the eighth case (Case 8).

Referring to FIG. 22, like the display device of the embodiments, in the fifth case (Case 5), the sixth case (Case 6), and the eighth case (Case 8), in which the opening of the first insulating layer includes the extension part, but the width of the extension part is smaller than 4 μm, even when the second insulating layer has a thickness of about 9 μm to be thinner than the conventional thickness of the second insulating layer as about 25 μm, it may be confirmed that the surface of the second insulating layer was well formed flat regardless of the difference in exposure energy.

As such, as in the display devices in the embodiments, when the opening of the first insulating layer includes the first extension part and the second extension part, and the width is less than 4 μm, and even when the second insulating layer has a thickness of about 9 μm to be thinner than the conventional thickness of the second insulating layer as about 25 μm, it may be confirmed that the surface of the second insulating layer was well formed flat.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
   a substrate;
   a pixel electrode disposed on the substrate;
   a bank layer in which a pixel opening is defined, the bank layer being disposed on the pixel electrode;
   an encapsulation layer disposed on the pixel electrode and the bank layer;
   a sensing electrode disposed on the encapsulation layer;
   a first insulating layer which is disposed on the sensing electrode and in which an opening overlapping the pixel opening is defined; and
   a second insulating layer disposed on the first insulating layer and having a higher refractive index than a refractive index of the first insulating layer,
   wherein the opening of the first insulating layer includes a first edge and a second edge separated from an edge of the pixel opening and extending in different directions from each other in a plan view, and a first extension part disposed at a portion where the first edge and the second edge meet in the plan view, and
   the first extension part protrudes from the portion where the first edge and the second edge meet in the plan view.

2. The display device of claim 1, wherein
   the first extension part has a first width and a first length, and
   the first length is larger than the first width.

3. The display device of claim 2, wherein
   the first width decreases as the first width is farther from the edge of the pixel opening,
   the first width is smaller than about 4 micrometers, and
   the thickness of the second insulating layer is about 9 micrometers to about 11 micrometers.

4. The display device of claim 1, wherein
   the opening of the first insulating layer further includes a second extension part disposed at a center of the first edge and the second edge.

5. The display device of claim 4, wherein
   the first extension part has a first width and a first length, and
   the second extension part has a second width and a second length, and
   the second length is larger than the second width.

6. The display device of claim 5, wherein
   the second width decreases as the second width is farther from the edge of the pixel opening, and
   the second width is smaller than about 4 micrometers.

7. The display device of claim 5, wherein
   the second length is equal to or shorter than the first length.

8. The display device of claim 4, wherein
   the first extension part includes a first sub-extension part and a second sub-extension part extending in a direction parallel to a first direction, and a third sub-extension part and a fourth sub-extension part extending in a direction parallel to a second direction different from the first direction,
   an imaginary first line overlapping the first sub-extension part and parallel to the first direction and an imaginary second line overlapping the second sub-extension part and parallel to the first direction do not overlap each other,
   an imaginary third line overlapping the third sub-extension part and parallel to the second direction and an imaginary fourth line overlapping the fourth sub-extension part and parallel to the second direction do not overlap each other,
   the second extension part includes a fifth sub-extension part and a sixth sub-extension part extending in a direction parallel to a third direction oblique to the first direction and the second direction, and a seventh sub-extension part and an eighth sub-extension part extending in a fourth direction oblique to the first direction and the second direction and different from the third direction,
   the fifth sub-extension part and the sixth sub-extension part overlap an imaginary fifth line parallel to the third direction, and
   the seventh sub-extension part and the eighth sub-extension part overlap an imaginary sixth line parallel to the fourth direction.

9. The display device of claim 1, wherein
   the pixel opening includes a plurality of pixel opening edges extending in different directions, and
   the pixel opening has a polygonal planar shape with a chamfered corner between adjacent pixel opening edges of the plurality of pixel opening edges extending in the different directions.

10. The display device of claim 9, wherein
in a plan view, the opening of the first insulating layer is larger than the pixel opening, and
the first edge and the second edge of the opening of the first insulating layer are substantially parallel to the plurality of pixel opening edges.

11. The display device of claim 1, wherein
an end of the first extension part has a convex curved line shape, and
a width of the first extension part decreases as the width of the first extension part is farther from the edge of the pixel opening.

12. The display device of claim 1, wherein
an end of the first extension part has a planar shape which is pointed toward the end, and
a width of the first extension part decreases as the width of the first extension part is farther from the edge of the pixel opening.

13. The display device of claim 1, wherein
an end of the first extension part has a planar shape of a straight line, and
a width of the first extension part decreases as the width of the first extension part is farther from the edge of the pixel opening.

14. The display device of claim 1, wherein
the first extension part includes a first sub-extension part and a second sub-extension part extending in a direction parallel to a first direction, and a third sub-extension part and a fourth sub-extension part extending in a direction parallel to a second direction different from the first direction,
an imaginary first line overlapping the first sub-extension part and parallel to the first direction and an imaginary second line overlapping the second sub-extension part and parallel to the first direction do not overlap each other, and
an imaginary third line overlapping the third sub-extension part and parallel to the second direction and an imaginary fourth line overlapping the fourth sub-extension part and parallel to the second direction do not overlap each other.

15. A display device comprising:
a substrate;
a plurality of pixel electrodes disposed on the substrate;
a bank layer which is disposed on the plurality of pixel electrodes and in which a plurality of pixel openings overlapping the plurality of pixel electrodes is defined;
an encapsulation layer disposed on the plurality of pixel electrodes and the bank layer;
a sensing electrode disposed on the encapsulation layer;
a first insulating layer which is disposed on the sensing electrode and in which a plurality of first openings overlapping pixel openings among the plurality of pixel openings is defined; and
a second insulating layer disposed on the first insulating layer and having a higher refractive index than a refractive index of the first insulating layer,
wherein each of the plurality of first openings of the first insulating layer is separated from the edge of the pixel openings and includes a first edge and a second edge extending in different directions in a plan view, and a first extension part disposed at a portion where the first edge and the second edge meet in the plan view, and
the first extension part protrudes from the portion where the first edge and the second edge meet in the plan view.

16. The display device of claim 15, wherein
the plurality of pixel openings includes a first pixel opening in which an emission layer emitting a first color is disposed, a second pixel opening and a third pixel opening in which an emission layer emitting a second color is disposed, and a fourth pixel opening in which an emission layer emitting a third color is disposed, and
the plurality of first openings overlaps the first pixel opening and the fourth pixel opening.

17. The display device of claim 16, wherein
each of the plurality of first openings further includes a second extension part disposed at the center of the first edge and the second edge.

18. The display device of claim 15, wherein
the plurality of pixel openings includes a plurality of dots including a first pixel opening in which an emission layer emitting a first color is disposed, a second pixel opening and a third pixel opening in which an emission layer emitting a second color is disposed, and a fourth pixel opening in which an emission layer emitting a third color is disposed, and
the plurality of first openings overlaps some dots among the plurality of dots.

19. The display device of claim 16, wherein
each of the plurality of first openings further includes a second extension part disposed at the center of the first edge and the second edge.

20. The display device of claim 17, wherein
the first extension part includes a first sub-extension part and a second sub-extension part extending in a direction parallel to a first direction, and a third sub-extension part and a fourth sub-extension part extending in a direction parallel to a second direction different from the first direction,
an imaginary first line overlapping the first sub-extension part and parallel to the first direction and an imaginary second line overlapping the second sub-extension part and parallel to the first direction do not overlap each other, and
an imaginary third line overlapping the third sub-extension part and parallel to the second direction and an imaginary fourth line overlapping the fourth sub-extension part and parallel to the second direction do not overlap each other.

21. The display device of claim 20, wherein
the second extension part includes a fifth sub-extension part and a sixth sub-extension part extending in a direction parallel to a third direction oblique to the first direction and the second direction, and a seventh sub-extension part and an eighth sub-extension part extending in a fourth direction oblique to the first direction and the second direction and different from the third direction,
the fifth sub-extension part and the sixth sub-extension part overlap an imaginary fifth line parallel to the third direction, and
the seventh sub-extension part and the eighth sub-extension part overlap an imaginary sixth line parallel to the fourth direction.

* * * * *